(12) United States Patent
Jin et al.

(10) Patent No.: US 6,818,551 B2
(45) Date of Patent: Nov. 16, 2004

(54) METHODS OF FORMING CONTACT HOLES USING MULTIPLE INSULATING LAYERS

(75) Inventors: Beom-Jun Jin, Seoul (KR); Young-Pil Kim, Gyeonggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 19 days.

(21) Appl. No.: 10/241,026

(22) Filed: Sep. 11, 2002

(65) Prior Publication Data

US 2003/0048679 A1 Mar. 13, 2003

(30) Foreign Application Priority Data

Sep. 11, 2001 (KR) .................................... 2001-0055810

(51) Int. Cl.$^7$ .......................................... H01L 21/4763
(52) U.S. Cl. ...................................... 438/637; 438/253
(58) Field of Search ................................ 438/253, 622, 438/634, 637, 638, 640

(56) References Cited

U.S. PATENT DOCUMENTS

| 6,255,686 B1 | 7/2001 | Takeuchi et al. |
| 6,521,524 B1 * | 2/2003 | Wang et al. |
| 6,528,368 B1 * | 3/2003 | Park |

FOREIGN PATENT DOCUMENTS

JP          11-168199          7/2001

* cited by examiner

*Primary Examiner*—Phuc T. Dang
(74) *Attorney, Agent, or Firm*—Myers Bigel Sibley & Sajovec, P.A.

(57) ABSTRACT

The present invention provides methods of forming contact holes and integrated circuit devices having the same. A conductive plug is formed on a substrate. A first insulating layer is formed on the conductive plug and a second insulating layer is formed on the first insulating layer. The second insulating layer is etched to expose at least a portion of the first insulating layer and the first insulating layer is etched to expose at least a portion of the conductive plug.

24 Claims, 30 Drawing Sheets

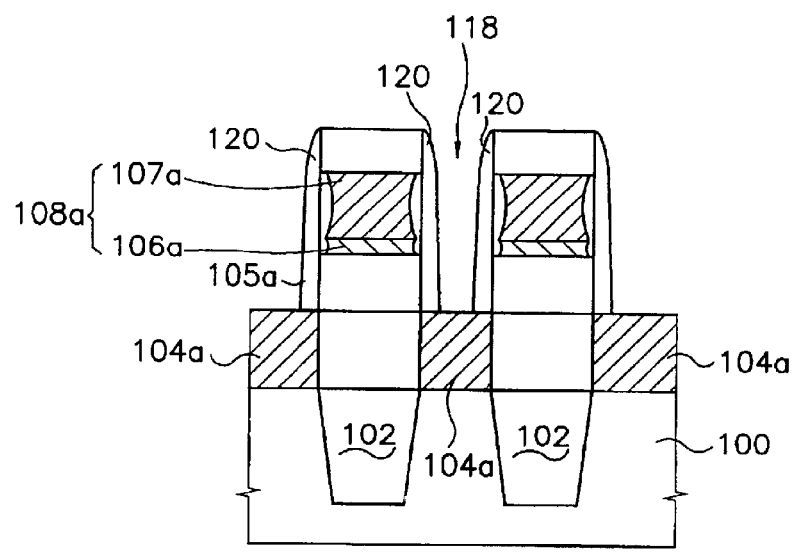
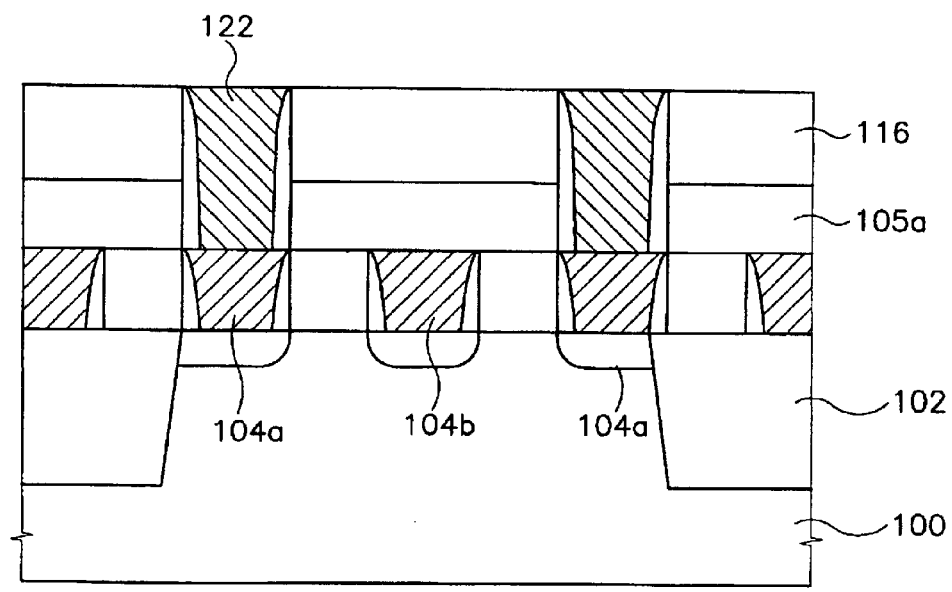

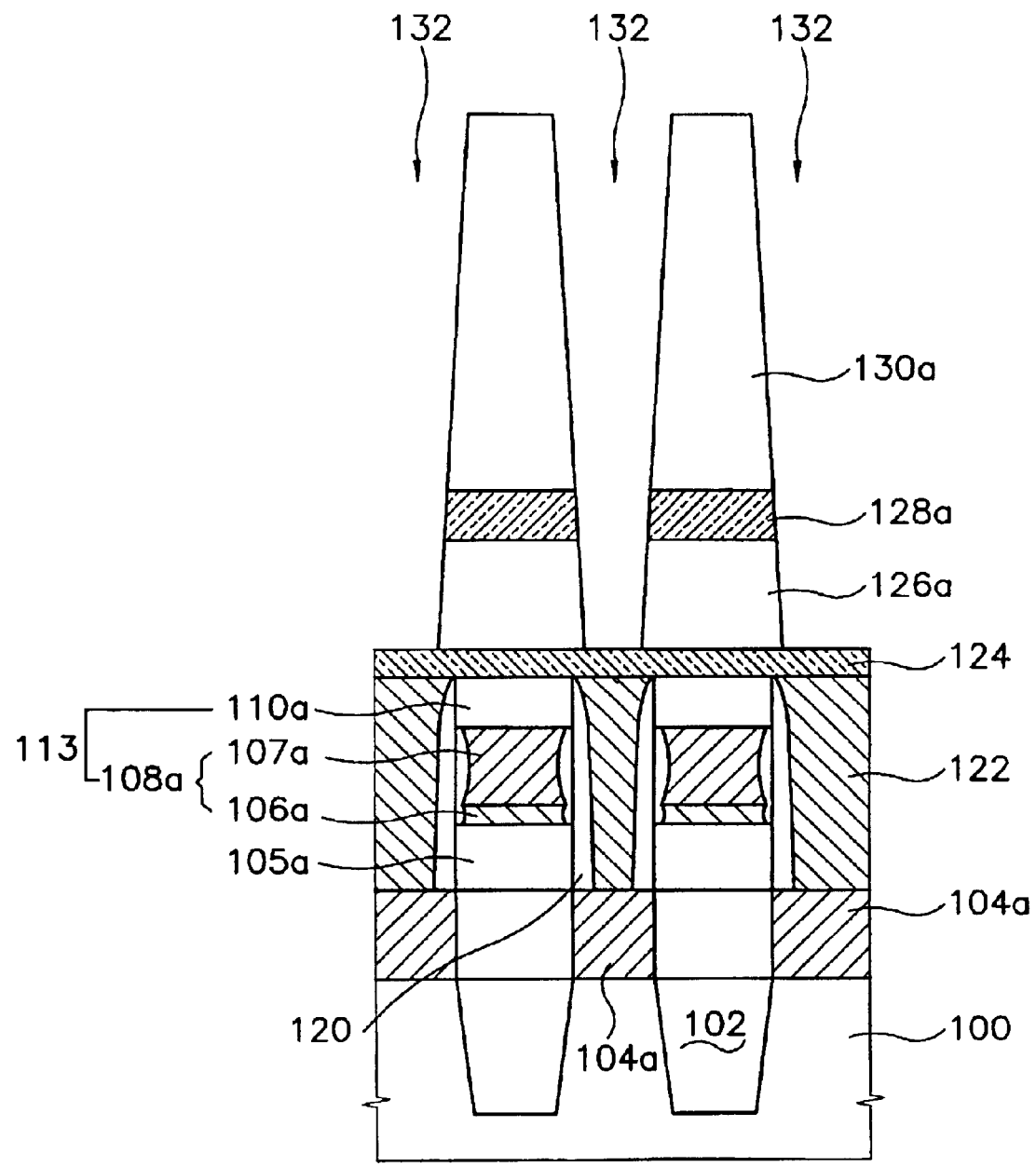

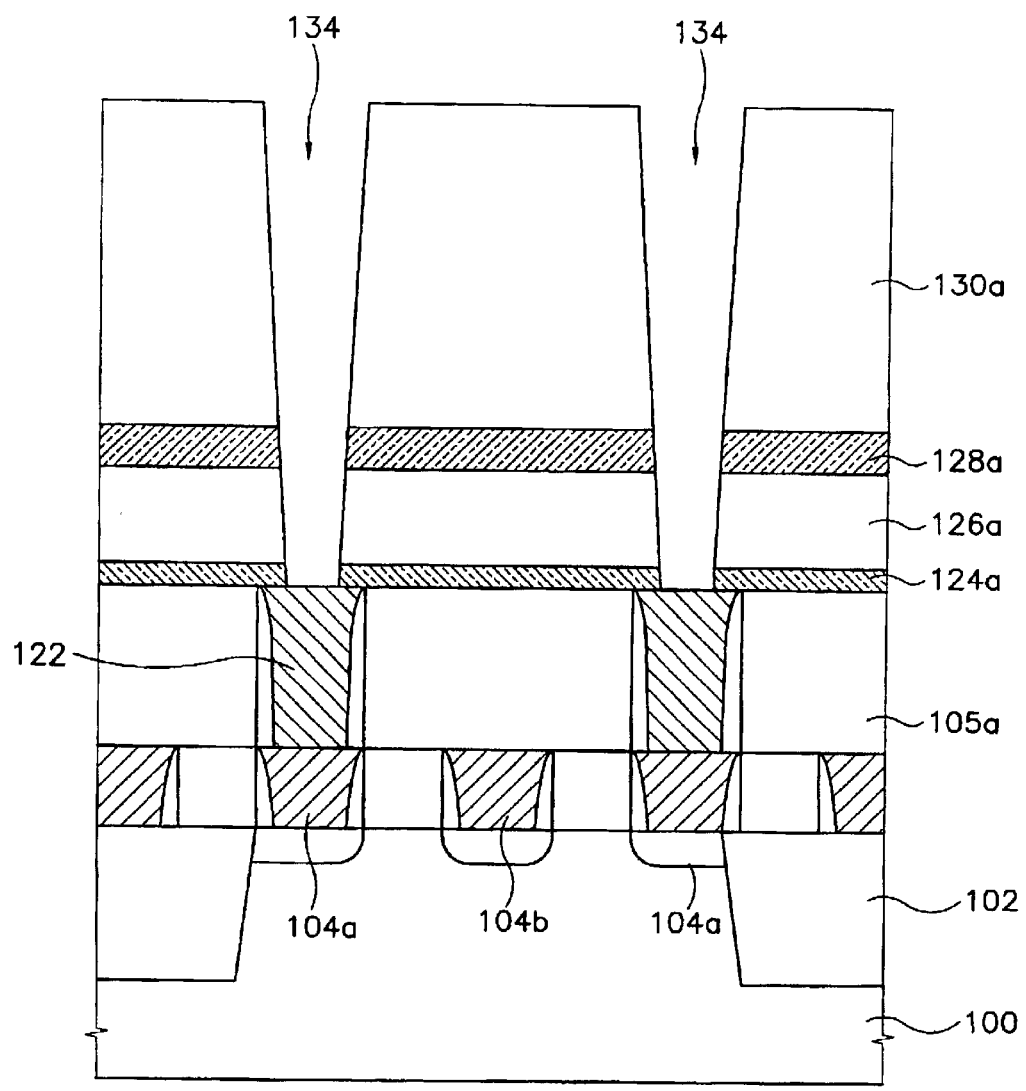

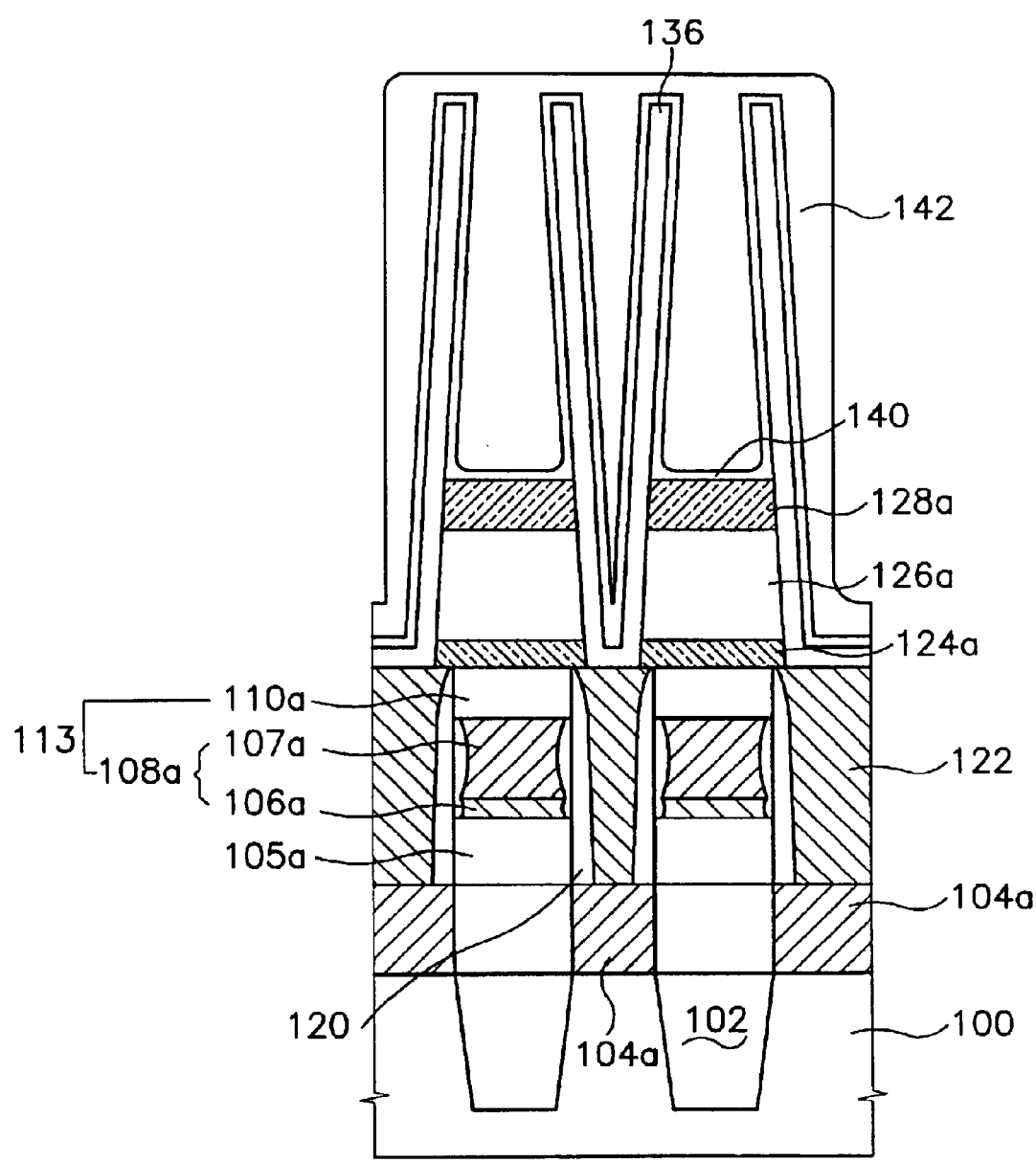

METHODS OF FORMING CONTACT HOLES USING MULTIPLE INSULATING LAYERS

RELATED APPLICATION

This application is related to and claims priority from Korean Application No. 2001-0055810, filed Sep. 11, 2001, the disclosure of which is hereby incorporated herein by reference.

FIELD OF THE INVENTION

The present invention relates to methods of forming integrated circuit devices and, more particularly, to methods of forming contact holes and integrated circuit devices having the same.

BACKGROUND OF THE INVENTION

As integrated circuit devices become more highly integrated the fabrication process of these devices may become more difficult. For example, because the devices themselves have decreased in size, the space between the electrical wires in these devices as well as the width of the electrical wires themselves may decrease in size. Accordingly, contact holes that are formed between these wires have also been influenced, for example, contact holes may have a decreased diameter and/or increased depth. Contact holes of this nature are difficult to manufacture.

Contact holes having narrow diameters and increased depths, present in, for example, dynamic random access memory (DRAM) cells, may be formed using a self-aligned contact method. Typically, methods employing a self-aligned contact method do not require alignment of an etching mask. Further, using a self-aligned contact method may enable the manufacture of smaller contact holes without an additional alignment margin.

According to conventional methods of forming self-aligned contact holes, a plurality of first patterns are formed on the integrated circuit substrate. The first pattern typically includes a conductive layer pattern and a silicon nitride layer pattern formed on the conductive layer pattern. A nitride spacer is formed on a sidewall of the first pattern. An insulating layer is formed on the resulting structure by depositing silicon oxide on the surface of the resulting structure. A photoresist pattern is formed to expose portions of the first patterns. The insulating layer is anisotropically etched using the photoresist pattern as an etching mask to form a contact hole exposing a surface of the substrate between the first patterns.

According to conventional methods, forming a conductive material between the first patterns before forming a contact hole may be difficult because the small space between the first patterns may be further decreased by the presence of a nitride spacer formed on the sidewall of the first pattern. One solution to this problem is to reduce the thickness of the nitride spacer. However, reducing the thickness of the spacer such that there is space for the conductive material may cause an electric short to occur between the conductive layer pattern and conductive material deposited in the contact hole. This type of short is typically referred to as the bridge phenomenon and it typically occurs when the nitride spacer is too thin and, thus, etched through during subsequent etching processes.

Furthermore, since the spacer includes silicon nitride which has a dielectric constant of more than about 7 and the dielectric constant of an oxide layer has a dielectric constant of about 3.9, the parasitic capacitance of the first pattern may increase. When the parasitic capacitance increases, the response speed of the integrated circuit device may decrease during the operation thereof.

Solutions to the above identified problems with conventional fabrication methods have been attempted. For example, Japanese Patent Application Publication No. 11-168199 discusses a method wherein the contact hole is formed first and a spacer is formed on the inner side surface of the contact hole.

The method of manufacturing a DRAM discussed in the above referenced Japanese Patent Application will be discussed below with respect to FIGS. 1A to 1D. FIGS. 1A to 1D are cross sectional views illustrating conventional methods of manufacturing DRAM as discussed in the above referenced Japanese Patent Application.

Referring now to FIG. 1A, a first insulating layer 12 comprising, for example, a silicon oxide layer, is formed on an integrated circuit substrate 10. A gate oxide layer (not shown) and gate electrode (not shown) are formed on the integrated circuit substrate. Conductive patterns 14 that function as bit lines are formed on the first insulating layer 12. A second insulating layer 16 and a third insulating layer 18 are sequentially deposited on the surface of the resulting structure. The second insulating layer 16 is typically formed of silicon oxide and the third insulating layer 18 is typically formed of silicon nitride.

Referring now to FIG. 1B, a first contact hole 20 is formed to expose a portion of the integrated circuit substrate 10. A photoresist pattern is formed on the third insulating layer 18. The third 18, second 16 and first 12 insulating layers are sequentially etched using the photoresist pattern as an etching mask, such that a first contact hole 20 is formed that exposes at least a portion of the integrated circuit substrate 10.

Referring now to FIG. 1C, a spacer 22 is formed on a sidewall of the first contact hole 20. In particular, a silicon oxide layer is deposited on the third insulating layer 18 and in the first contact hole 20 (FIG. 1B). The silicon oxide layer is anisotropically etched to form a spacer 22 on the sidewalls of the first contact hole 20.

Referring now to FIG. 1D, a capacitor electrode is formed on the integrated circuit substrate 10. In particular, a conductive material is deposited to a predetermined thickness on the third insulating layer 18, in the contact hole 20 and on the spacer 22. The conductive material is patterned to form a stacked storage electrode 24. A dielectric layer 26 and a plate electrode 28 are sequentially formed on the storage electrode 24, thereby completing the capacitor electrode, the spacer 22 insulating the storage electrode 24 from the conductive pattern 14.

According to conventional methods of fabricating DRAMs discussed above, the area of the bottom of the first contact hole 20 is enlarged because the first contact hole 20 is formed prior to the formation of the spacer 22. In addition, the parasitic capacitance of the conductive pattern decreases since the spacer 22 is formed using silicon oxide.

However, when the contact hole 20 is small in diameter and/or deep, the conventional methods may present a problem. For example, since the storage electrode 24 has a stacked shape, enlargement of an area of the storage electrode 24 is limited and, therefore, a capacitance of the capacitor may decrease. Furthermore, if the sidewall of the first contact hole 20 is formed to have a step, the silicon oxide layer may not be deposited uniformly, which may result in the bridge phenomenon between the conductive pattern 14 and the storage electrode 24.

In the above-mentioned fabrication methods of DRAM, one or more cylindrical storage nodes may be formed so as to enlarge the surface area of the storage electrode 24.

Now referring to FIGS. 2A and 2B, cross sectional views illustrating fabrication of conventional DRAM cells including a cylindrical storage node will be discussed. As illustrated in FIG. 2A, a conductive material is deposited in the first contact hole (20 in FIG. 1B) to form a conductive plug 40. An oxide layer 42 is deposited on the surface of the conductive plug 40. A predetermined portion of the oxide layer 42 is etched away forming a second contact hole 44 that partially exposes the conductive plug 40. The cylindrical storage node 46 is formed in the second contact hole 44.

However, if the second contact hole 44 is formed without being precisely aligned with the conductive plug 40 disposed below the second contact hole 44, the oxide layer 42 may be over etched and the spacer 12 disposed on the side of the conductive pattern 14 may be accidentally etched away as illustrated by the broken lines in FIG. 2B. The spacer 12 may be accidentally etched because the spacer 22 and the oxide layer 40 have similar etching rates. Accordingly, a pattern bridge (an electrical connection) may occur between the conductive pattern 14 (functioning as bit line) and the storage electrode 48 and the integrated circuit device may not function correctly or at all.

SUMMARY OF THE INVENTION

Embodiments of the present invention provide methods of forming contact holes and integrated circuit devices having the same. Methods according to embodiments of the present invention include forming a conductive plug on a substrate. A first insulating layer is formed on the conductive plug and a second insulating layer is formed on the first insulating layer. The second insulating layer is etched to expose at least a portion of the first insulating layer and the first insulating layer is etched to expose at least a portion of the conductive plug.

In some embodiments of the present invention, the second insulating layer is preferentially etched with respect to the first insulating layer and the first insulating layer is preferentially etched with respect to the second insulating layer and the conductive plug. The second insulating layer may be thicker than the first insulating layer. The first insulating layer may have a thickness of from about 30 to about 150 Å.

In further embodiments of the present invention, the process of forming a conductive plug includes forming a first conductive layer on the substrate and forming a third insulating layer on the first conductive layer. The first conductive layer and the third insulating layer may define a contact hole. A spacer is formed on the sidewalls of the first conductive layer and the third insulating layer and a conductive material may be deposited in the second contact hole to form the conductive plug.

In still further embodiments of the present invention the process of forming the first conductive layer may include forming a barrier metal layer on the substrate and forming a metal layer on the barrier metal layer. The barrier metal layer may include titanium and/or titanium nitride and the metal layer may include tungsten. A width of the first conductive layer may be smaller than a width of the third insulating layer.

DETAILED DESCRIPTION OF EMBODIMENTS OF THE PRESENT INVENTION

Figure 1A:
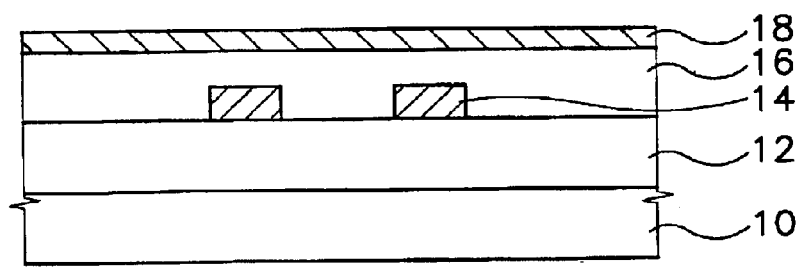
FIGS. 1A to 1D are cross sectional views illustrating conventional methods of fabricating dynamic random access memory (DRAM) cells.
Figure 1B:
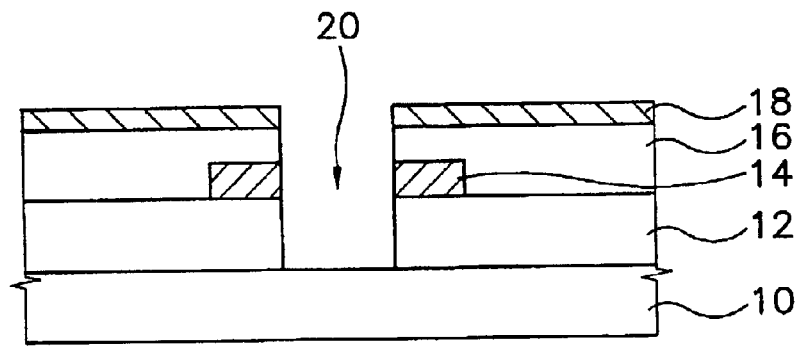
Figure 1C:
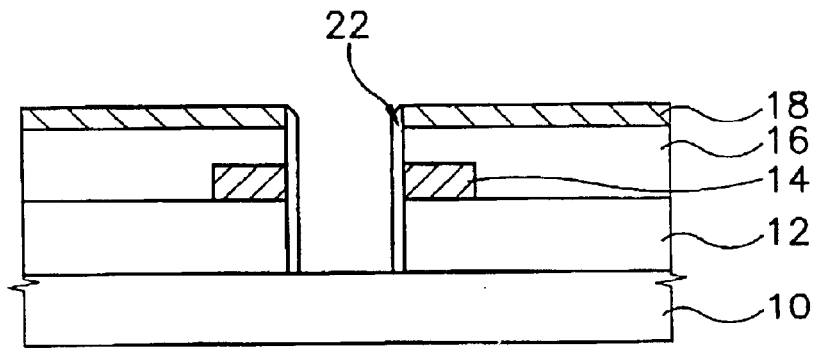
Figure 1D:
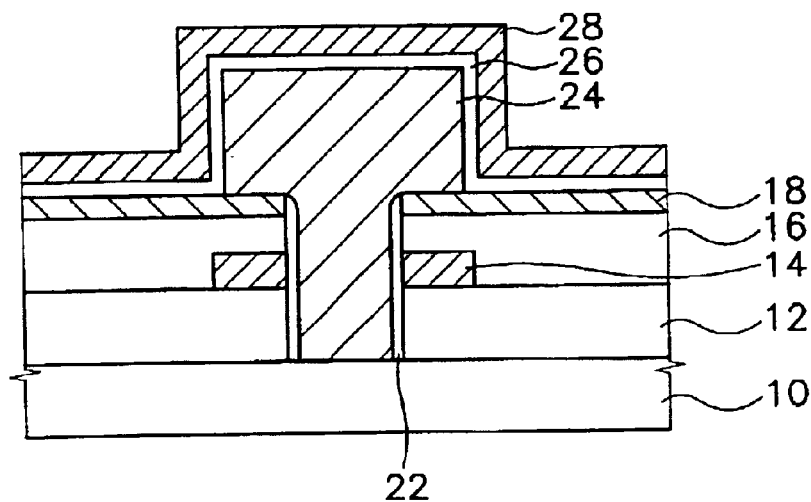
Figure 2A:
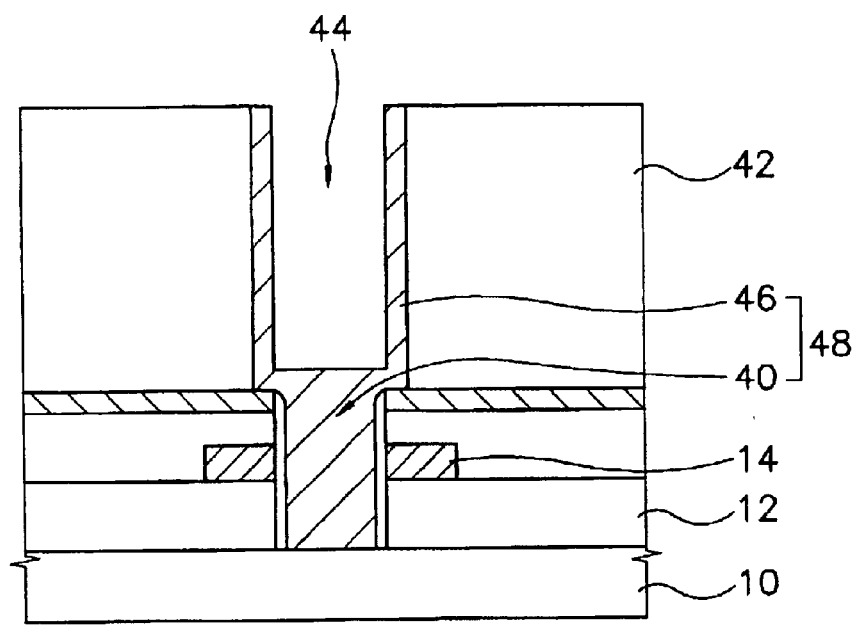
FIGS. 2A and 2B are cross sectional views illustrating conventional methods of fabricating DRAM cells including cylindrical storage nodes.
Figure 2B:
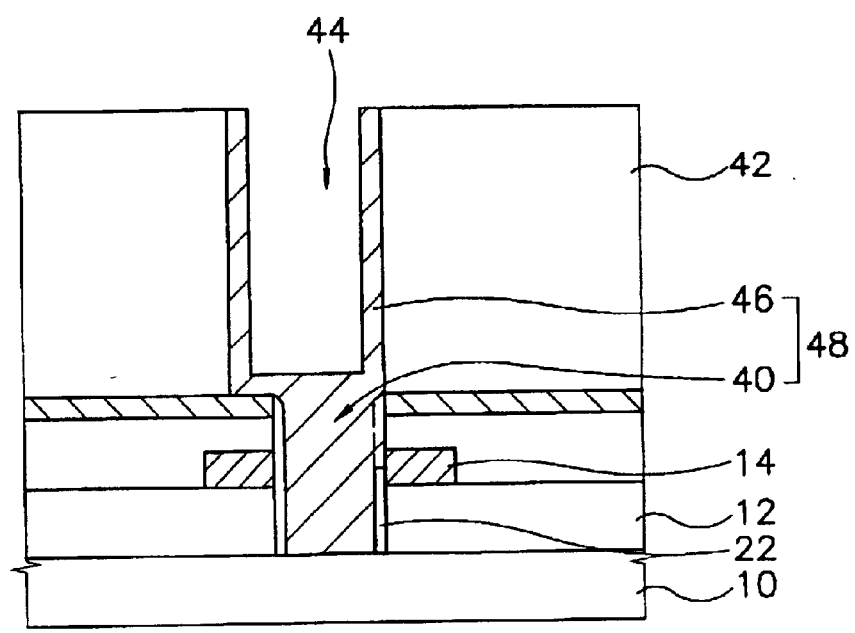

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will also be understood that when a layer is referred to as being "on" another layer or substrate, it can be directly on the other layer or substrate, or intervening layers may also be present. Like reference numerals refer to like elements throughout.

Embodiments of the present invention will be described with respect to FIGS. 3A through 18B. Embodiments of the present invention provide methods of fabricating contact holes and integrated circuit devices having the same. A contact hole is provided having a sidewall. Spacers are provided on the sidewall and a conductive material is deposited in the contact hole to form a conductive plug. A first stopping layer is formed on the first insulating layer and the conductive plug. The presence of the first stopping layer may reduce the likelihood that the spacer layer will be influenced by a subsequent etching process. Accordingly, embodiments of the present invention may reduce the occurrence problems present in the conventional methods. For example, methods according to embodiments of the present invention may reduce the occurrence of the bridge phenomenon and increase the overall functionality of the device.

Figure 3A:
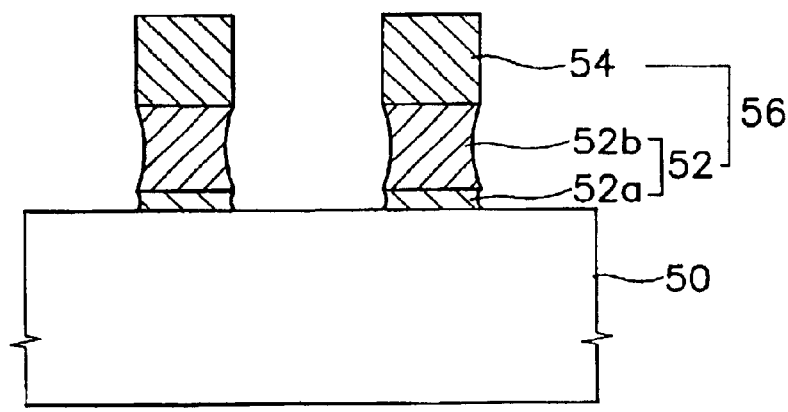
FIGS. 3A to 3G are cross sectional views illustrating methods of forming contact holes according embodiments of the present invention.

Referring now to FIG. 3A, a cross section illustrating methods of fabricating a contact hole will be discussed. First patterns 56 are provided on an integrated circuit substrate 50 such as a silicon semiconductor substrate. In particular, a first conductive layer is formed on the substrate 50. The first conductive layer may include a barrier metal layer formed on the substrate 50 and a metal layer formed on the barrier metal layer. The barrier metal layer may include, for example, titanium and/or titanium nitride. The metal layer may include, for example, tungsten. The barrier metal layer may protect the metal layer from being lifted during subsequent thermal processes. A first insulating layer is formed on the first conductive layer. The first insulating layer may include, for example, silicon nitride and/or silicon oxide.

A photoresist film is deposited on the first insulating layer using, for example, a spin-coating method. The photoresist film is partially removed using, for example, a photo process to form a photoresist pattern. The first insulating layer, the metal layer and the barrier metal layer are sequentially etched using the photoresist pattern as an etching mask to form each of the first patterns 56. As illustrated in FIG. 3A, the first patterns 56 include a first conductive layer pattern 52 and a first insulating layer pattern 54. The first conductive layer pattern includes a barrier metal layer pattern 52a and a metal layer pattern 52b.

The first conductive layer pattern 52 may be formed to have a width that is smaller than the width of the first insulating layer pattern, as illustrated in FIG. 3A. In particular, the first insulating layer pattern 54 may be formed by ansiotropically etching the first insulating layer. The first insulating layer pattern 54 may be etched by adjusting the etchant of the metal layer disposed under the first insulating layer pattern 54 such that the lower sides of the first insulating layer pattern 54 are under-cut. Accordingly, a metal layer pattern 52b may be formed having a smaller width than that of the first insulating layer pattern 54 by from about 10 to about 100 Å.

Similarly, the etchant of the barrier metal layer may be adjusted such that the barrier metal layer pattern 52a has a smaller width than the first insulating layer pattern 54 by from about 10 to about 100 Å. Accordingly, the width of the metal layer pattern 52b may be substantially similar to the width of the barrier metal layer pattern 52a.

Figure 3B:
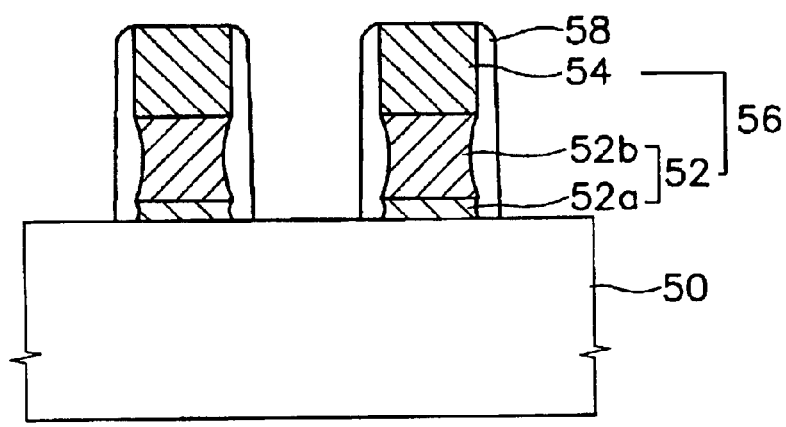

Referring now to FIG. 3B, a spacer 58 is formed on the sidewalls of the first patterns 56. The spacer 58 may insulate a later formed conductive layer from the first patterns 56. The spacer may include, for example, silicon oxide. The dielectric constant of silicon oxide is lower than that of silicon nitride, which is typically used in conventional devices. The use of a material having a lower dielectric constant may reduce the parasitic capacitance between the first patterns 56 and the later formed conductive layer.

In particular, the spacer 58 may be formed by depositing a silicon oxide layer on the surface of the integrated circuit substrate 50 and the surface/sidewalls of the first patterns 56. The silicon oxide layer is anisotropically etched to form the spacer 58 on the sidewalls of the first patterns 56 as illustrated in FIG. 3B. The silicon oxide layer is deposited at a temperature of about 400° C. or less to prevent the first conductive layer pattern 52 from being oxidized. Furthermore, the silicon oxide layer deposited on the sidewalls of the first patterns 56 typically has a sufficient and uniform deposition thickness and a good step coverage of the silicon oxide layer. The silicon oxide layer on the sidewalls of the first patterns 56 is deposited, for example, using catalytic atomic layer deposition (CALD).

Although a particular method of fabricating the spacer 58 is discussed above, the present invention is not limited to this process. The spacer 58 may be formed by another method without departing from the teachings of the present invention. For example, a silicon oxide layer may be deposited having a sufficient thickness such that each of the first patterns 56 are covered by the silicon oxide layer. The silicon oxide layer may then be etched to form a contact hole exposing a side of each of the first patterns 56 and a surface of the integrated circuit substrate 50.

A photoresist pattern perpendicular to the first patterns 56 may be formed on the first patterns 56 and the silicon oxide layer. The silicon oxide layer may be etched using the first patterns 56 and the photoresist pattern as an etching mask, such that a contact hole is formed between the first patterns 56. The spacer 58 may be formed on the sidewall of the contact hole.

Figure 3C:
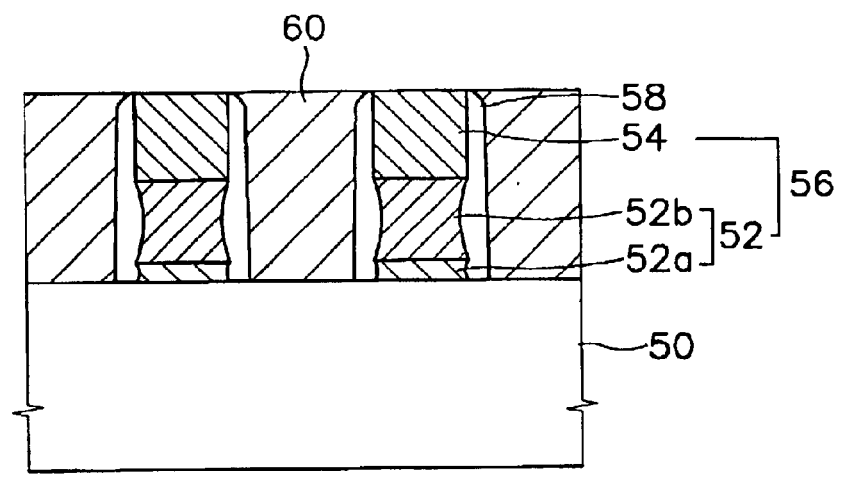

Referring now to FIG. 3C, a method of forming a conductive plug 60 in the contact hole according to embodiments of the present invention will be described. A conductive material is deposited in the contact hole and on the spacer 58, such that a second conductive layer is formed. The conductive material may include, for example, titanium nitride (TiN), tantalum nitride (TaN) and/or doped poly silicon. A surface of the second conductive layer is polished in such a manner that an upper surface of the first insulating layer pattern 54 is exposed and the space between the first patterns 56 is filled with the conductive material (conductive plug 60). The conductive plug 60 can function as a capacitor conductive layer.

Figure 3D:
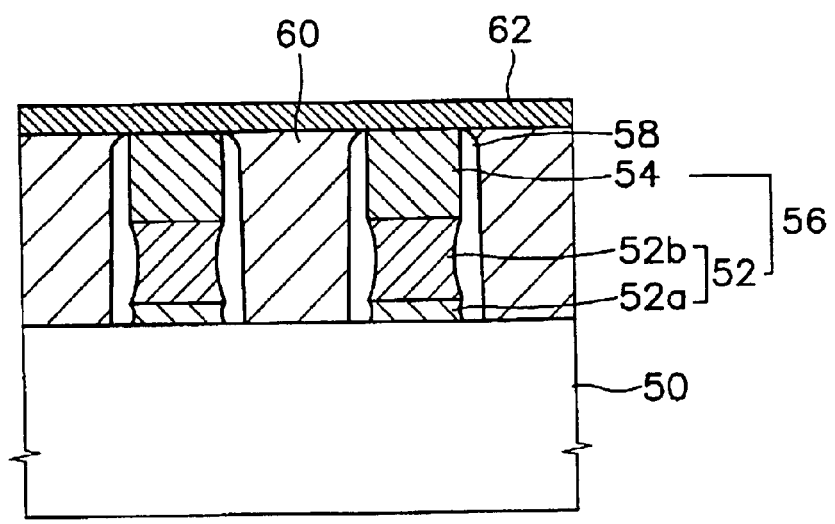

Referring to FIG. 3D, a first stopping layer 62 is formed on upper surfaces of the first patterns 56 and the conductive plug 60. The first stopping layer 62 may reduce the likelihood that the spacer 58 is influenced by subsequent etching processes and may allow the contact hole to align with the contact plug 60 in a subsequent process. The first stopping layer 62 may include, for example, silicon nitride and may have a thickness of from about 30 to about 150 Å. The first stopping layer 62 may be formed by, for example, plasma enhanced chemical vapor deposition (PECVD), an atomic layer deposition (ALD) and/or a chemical vapor deposition (CVD).

Figure 3E:
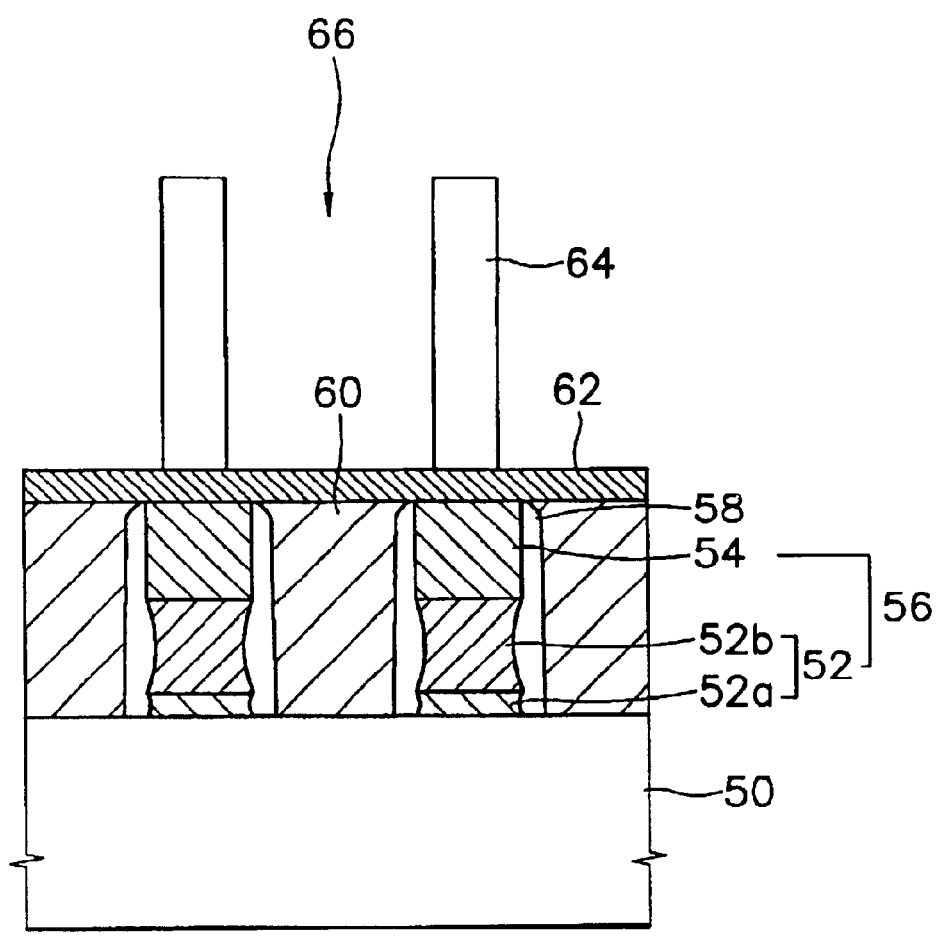

Referring to FIG. 3E, a second insulating layer 64 is formed on the first stopping layer 62. The second insulating layer 64 is partially etched exposing the first stopping layer 62 disposed on the surface of the conductive plug 60, forming a preliminary contact hole 66.

Figure 3F:
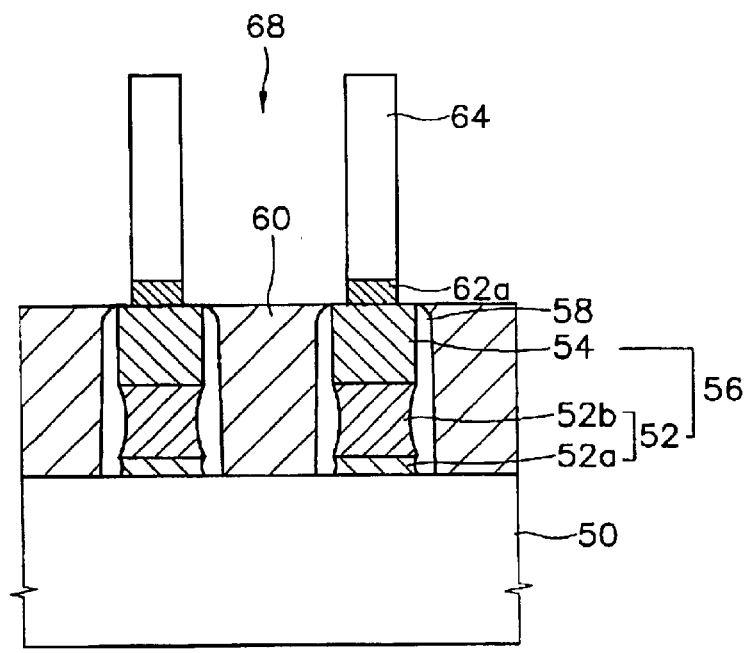

Referring to FIG. 3F, the exposed first stopping layer 62 is etched to form a contact hole 68 making contact with the conductive plug 60. The first stopping layer 62 is etched with a post-etch treatment for removing residue of the second insulating layer 64, so that damage to the first patterns 56 can be minimized and a contact resistance can be reduced.

Figure 3G:
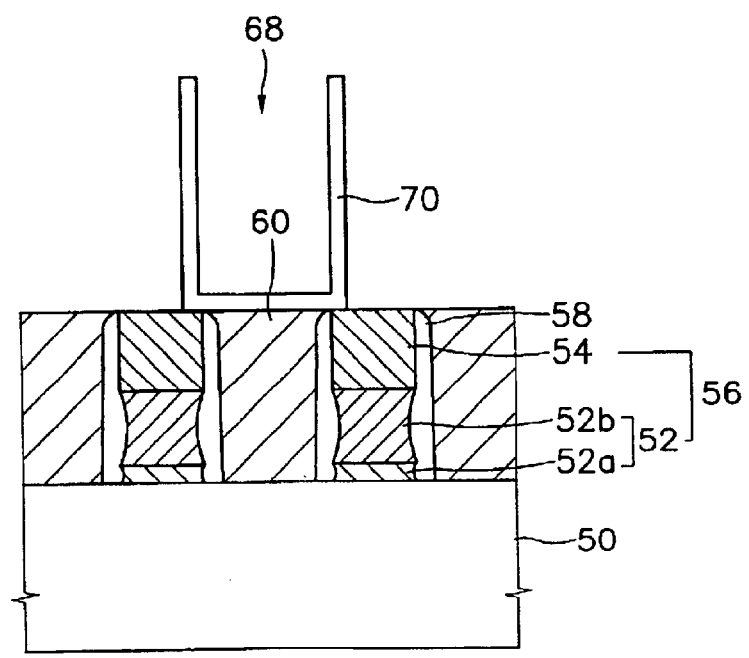

As illustrated in FIG. 3G a storage node of a capacitor 70 may be formed by polishing an upper portion of the contact hole 68, which already contains deposited conductive material. Furthermore, electric wires may also be formed on the polished upper portion of the contact hole 68.

Accordingly, when the second insulating layer 64 is etched to form the contact hole 68, the first stopping layer 62 may only be etched to the extent that the second insulating layer 64 is over etched because the etching selectivity of the first stopping layer 62 and the second insulating layer 64 is so large. Therefore, the second insulating layer 64 may be etched to expose the first stopping layer 62 and the exposed first stopping layer 62 may be etched to expose at least a portion of the conductive plug 60. Furthermore, even though a photo-misalign may be generated during the etching of the second insulating layer 64, the spacer 58 disposed on the sidewall of the first patterns 56 may not be etched since the first stopping layer 62 reduces the likelihood that the spacer 58 will be etched. Accordingly, a process failure resulting from an over etching of the spacer 58, for example, the generation of a pattern bridge between the first patterns 56 and the conductive plug 60, is less likely to occur.

Figure 4:
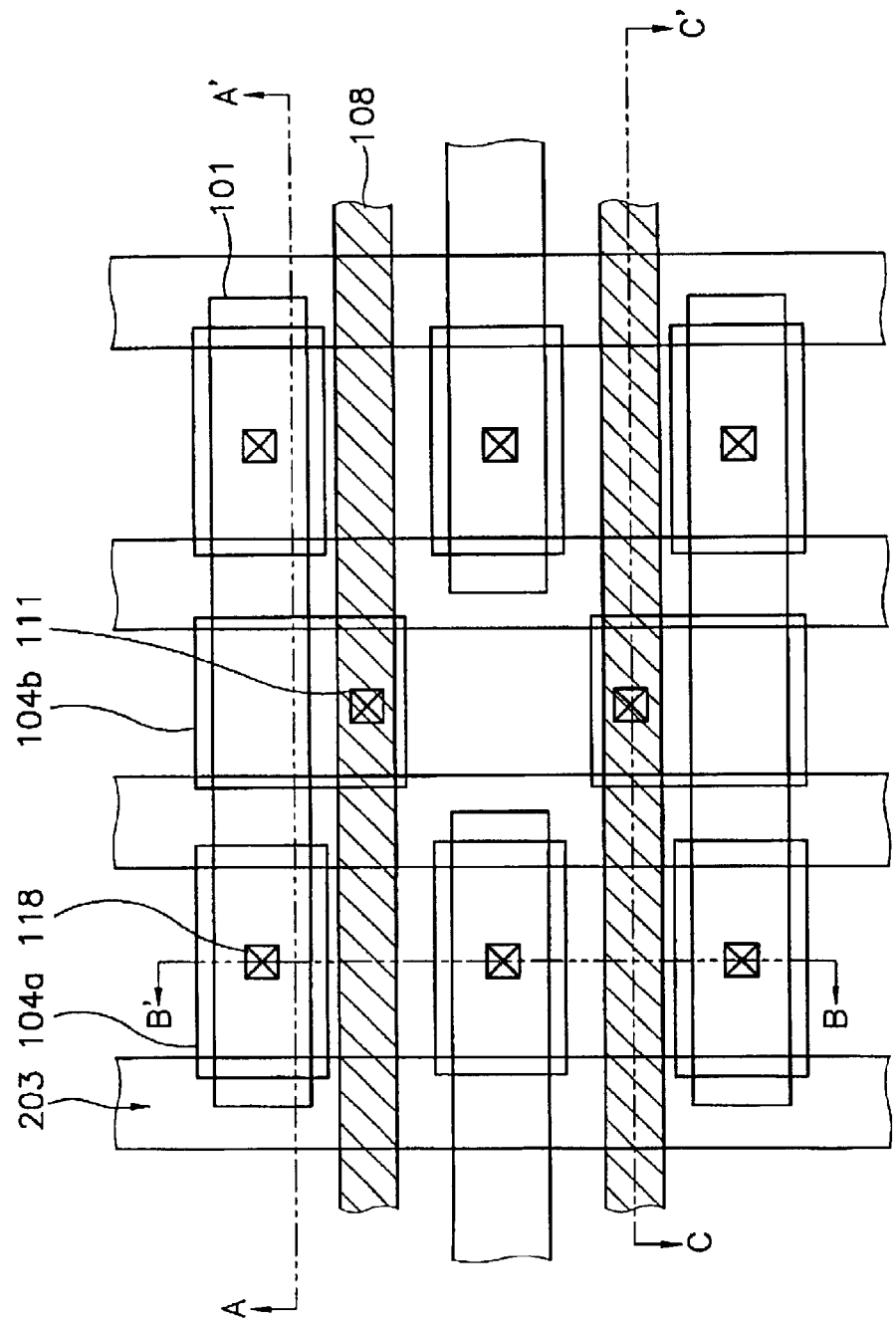
FIG. 4 is a plan view of a DRAM cell according to further embodiments of the present invention.

Embodiments of the present invention will now be discussed with respect to FIGS. 4 through 18B. Referring now to FIG. 4, a plan view of a dynamic random access memory (DRAM) cell according to embodiments of the present invention will be discussed. FIGS. 5A to 18B are cross sectional views illustrating methods of manufacturing a DRAM cell according to the embodiments of the present invention. FIGS. 5A through 6A and 8A through 18A are cross sectional views of the DRAM cell taken along the line A–A' shown in FIG. 4. FIGS. 5B through 18B are cross sectional views of the DRAM cell taken along the line B–B' shown in FIG. 4. FIG. 7A is cross sectional view of the DRAM cell taken along the line C–C' shown in FIG. 4.

Figure 5A:
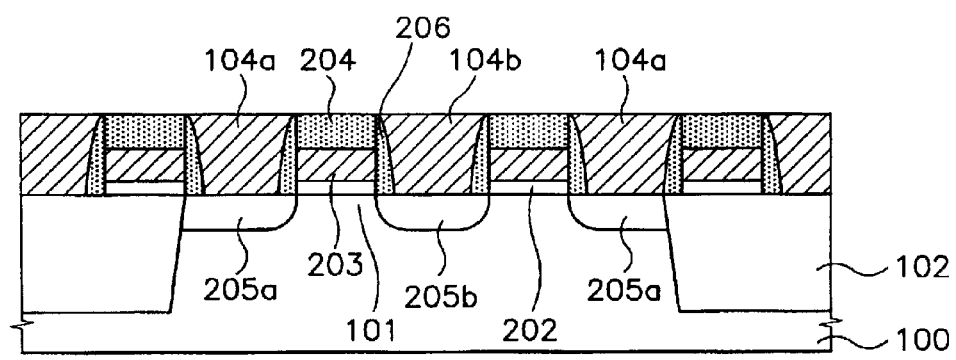
FIGS. 5A to 18B are cross sectional views illustrating methods of manufacturing DRAM cells according to the further embodiments of the present invention.
Figure 5B:
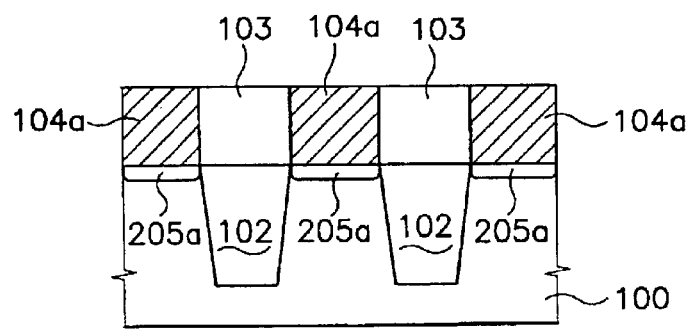

Referring now to FIGS. 5A and 5B, first and second pad electrodes 104a and 104b are formed on an integrated circuit substrate 100. The first pad electrode 104a and the second pad electrode 104b are on a source region and a drain region, respectively, of a MOS transistor for reducing an aspect ratio of a contact hole formed by subsequent process.

In particular, an isolation oxide layer 102 is formed on the integrated circuit substrate 100 using an isolation process, such as a shallow trench isolation (STI) process to define an active area 101 in the integrated circuit substrate 100. The MOS transistor is formed on the active area 101 of the integrated circuit device 100.

In particular, a thin gate oxide layer 202 is formed on a surface of the active area 101 using a thermal oxidation method. A gate electrode 203 of the MOS transistor is formed on a surface of the gate oxide layer 202 that functions as a word line.

The gate electrode 203 may have a polycide structure including, for example, a polysiliconlayer and a tungsten poly silicide layer that are sequentially stacked on each other. The polysiliconlayer is doped with high-density impurities using a conventional doping process, such as a diffusing process, an ion implanting process, and/or an in-situ doping process. Further, a silicon nitride layer pattern 204 is formed on the gate electrode 203. A spacer 206, including, for example, silicon nitride, is formed on each sidewall of both the gate electrode 203 and the silicon nitride layer pattern 204. Impurities are implanted into the integrated circuit substrate 100 to form source/drain regions 205a, 205b of the MOS transistor on a surface of the active area 101. One of the source/drain regions, i.e. a doping area, is a capacitor contact area with which the storage electrode of the capacitor makes contact. The other of the source/drain regions is a bit line contact area with which the bit line makes contact. In some embodiments of the present invention, the source region 205a is the capacitor contact area, and the drain region 205b is the bit line contact area. In further embodiments the source/drain regions are reversed.

An insulating layer 103 including, for example, an oxide, such as borophosphosilicate glass (BPSG), is formed on the surface of the integrated circuit substrate 100 including the MOS transistor. The insulating layer is planarized by, for example, a chemical-mechanical polishing (CMP) process. The silicon nitride pattern layer 204 may function as a CMP stopper. The insulating layer 103 is etched with a high etching selectivity with respect to the silicon nitride pattern layer 204, such that a contact hole self-aligned with the gate electrode 203 is formed.

The polysilicon layer doped with the high-density impurities is deposited in the contact hole. The polysilicon layer is etched to expose the silicon nitride layer 204. Thus, the first pad electrode 104a and the second pad electrode 104b are formed in the contact hole, the first pad electrode 104a making contact with the source region 205a and the second pad electrode 104b making contact with the drain region 205b.

Figure 6A:
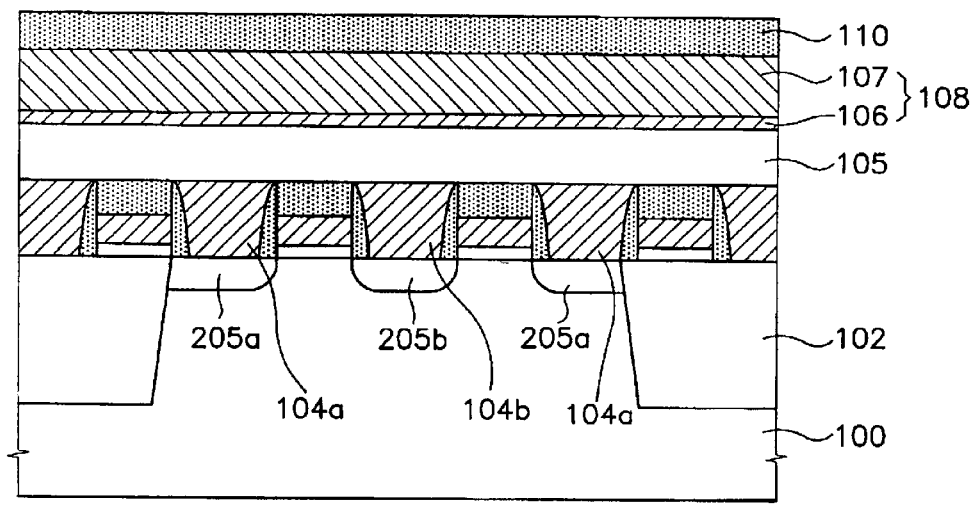
Figure 6B:
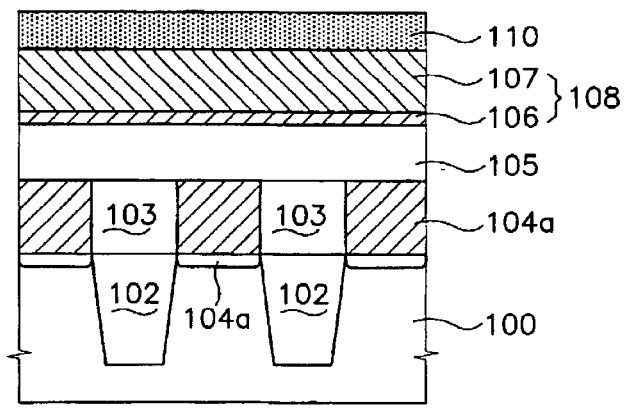
Figure 7A:
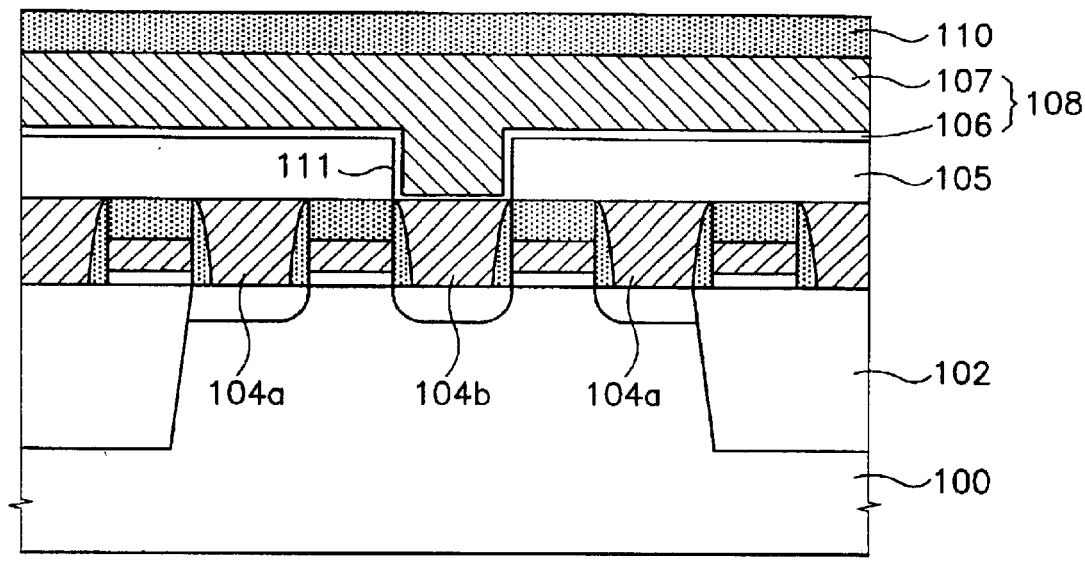

Referring now to FIGS. 6A, 6B and 7A, a process of forming an insulating interlayer 105, a conductive layer for bit line 108 (bit line conductive layer), and a first insulating layer 110 according to embodiments of the present invention will be discussed. The insulating interlayer 105 including, for example, silicon oxide based material, is formed on a surface of the integrated circuit substrate 100 including the first and the second pad electrodes 104a and 104b. The insulating interlayer 105 is partially etched using a photolithography process and a bit line contact hole 111 is formed, exposing the second pad electrode 104b.

The bit line conductive layer 108 is deposited on the insulating interlayer 105 and in the bit line contact hole 111. The bit line conductive layer 108 may be formed to have, for example, a composite layer structure including, for example, a metal and a metallic compound. In some embodiments of the present invention, the bit line conductive layer 108 includes a barrier metal layer 106 including, for example, Ti/TiN, and a metal layer 107 including, for example, tungsten. The barrier metal layer 106 may reduce the likelihood that the metal layer is lifted and that the resistance of the metal layer will increase during subsequent thermal processes. A first insulating layer 110 is deposited on the bit line conductive layer 108. The first insulating layer 110 may be a single layer including, for example, silicon nitride based material, or a composite layer including, for example, silicon oxide based material and silicon nitride based material.

The first insulating layer 110 may protect the bit line during subsequent etching processes to form the self-aligned contact hole. In some embodiments of the present invention, the double-layered bit line conductive layer 108 is formed to make direct contact with the bit line contact hole 111. Alternatively, the bit line conductive layer 108 may be formed to directly make contact with a bit line plug after forming the bit line plug in the bit line contact hole 111.

Figure 7B:
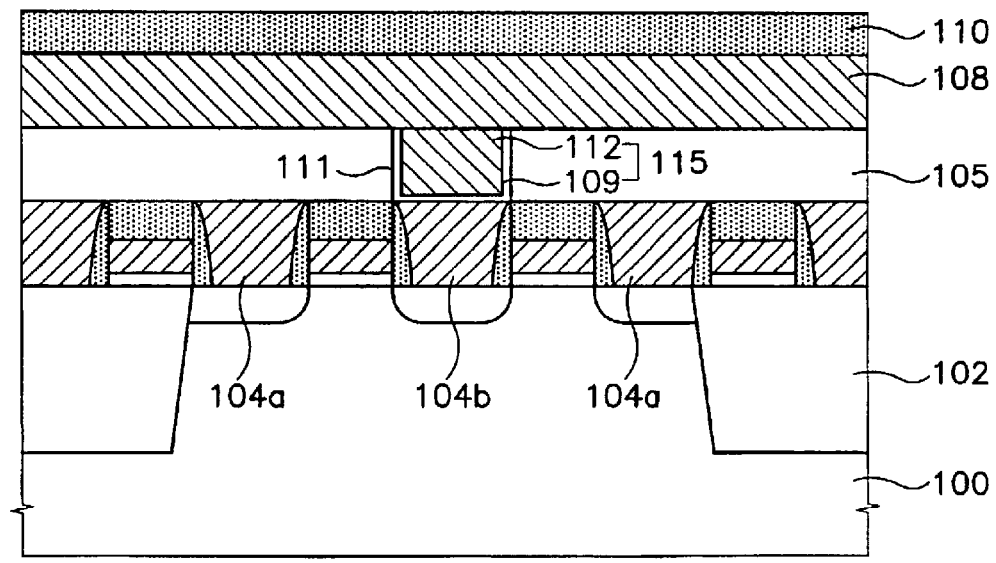

Now referring to FIG. 7B, a process of forming a bit line plug according to embodiments of the present invention will be described. The bit line contact hole 111 is formed. A barrier metal layer 109 is deposited on the bit line contact hole 111 and the insulating interlayer 105. In some embodiments of the present invention, the barrier metal layer 109 may include, for example, a titanium (Ti)/titanium nitride (TiN) layer. A metal layer 112, which may include, for example, tungsten, is deposited on a surface of the barrier metal layer 109. The metal layer 112 is partially removed using, for example, an etch back and a CMP process to expose a surface of the insulating interlayer 105. Accordingly, the bit line plug 115 includes the barrier metal layer 109 and the metal layer 112 in the bit line contact hole 111. The bit line conductive layer 108, including, for example, tungsten is deposited on the bit line plug 115 and the insulating interlayer 105. Accordingly, the bit line conductive layer 108 is formed into a single layer.

Figure 8A:
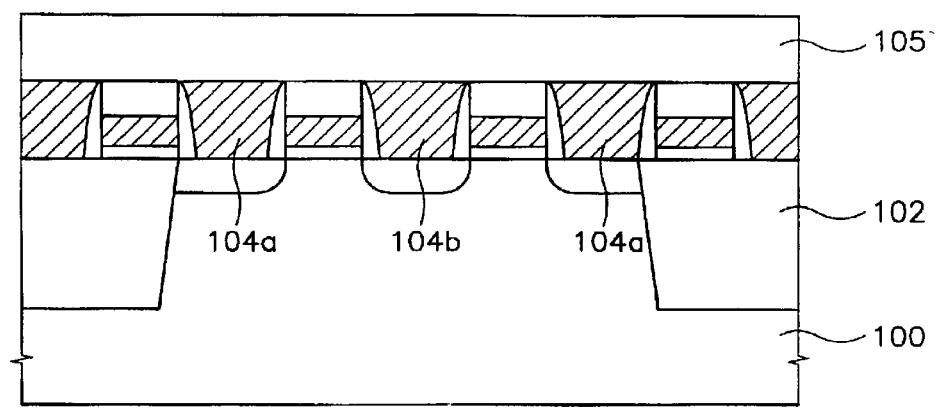
Figure 8B:
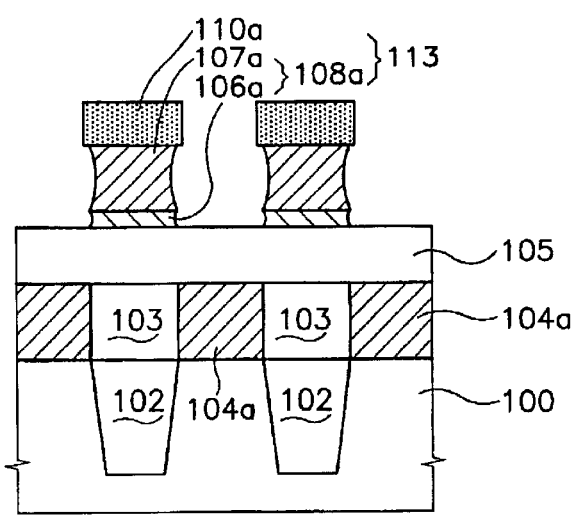

Referring now to FIGS. 8A and 8B, the process of forming a bit line structure according to embodiments of the present invention will be described. A first photoresist pattern (not shown) for patterning the bit line is formed on the first insulating layer 110 using a photolithography process. The first insulating layer 110 and the bit line conductive layer 108 are sequentially etched using the photoresist pattern as an etching mask. Accordingly, a plurality of the bit line structures 113 are formed on the integrated circuit substrate 100 at regular intervals, each of the bit line structures including a first insulating layer pattern 110a and a bit line conductive layer pattern 108a. The plurality of the bit line structures 113 are formed into a linear shape, such that they function as electrical wirings through which electrical signals flow to each of the DRAM cells.

The bit line conductive layer pattern 108a may be formed to have a smaller width than that of the first insulating layer pattern 110a by, for example, adjusting the etchant of the bit line conductive layer 108. In addition, an anti-reflection layer (not shown) may be formed on the first insulating layer 110 before the first photoresist pattern is formed to improve the performance of the photolithography process. In some embodiments of the present invention, the anti-reflection layer may be formed as a single layer of, for example, silicon oxynitride (SiON), or as a composite layer of, for example, a thermal silicon oxide layer and a silicon oxynitride (SiON) layer. The anti-reflection layer may reduce the likelihood that a light scattering will occur on a lower substrate during subsequent photolithography processes.

Figure 9A:
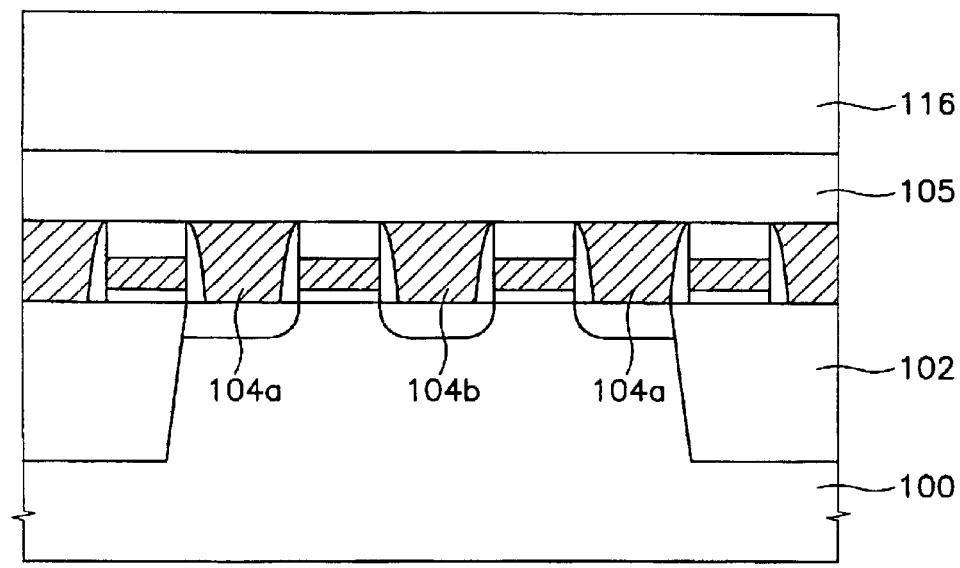
Figure 9B:
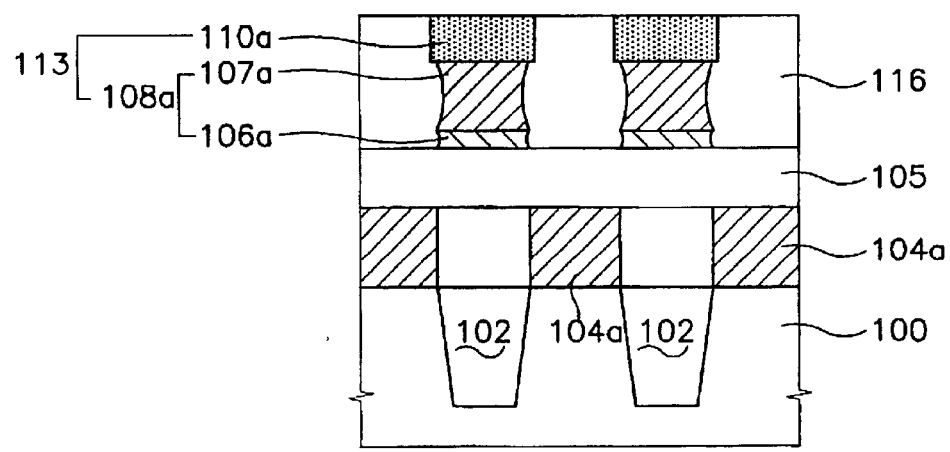

Referring now to FIGS. 9A and 9B, a process of forming a second insulating layer 116 according to embodiments of the present invention will be described. The first photoresist pattern is removed using, for example, an etching process and a stripping process. A second insulating layer 116 including, for example, a silicon oxide based material, is deposited on a surface of the resulting structure, on which the bit line structures 113 are formed. As illustrated in FIGS. 9A and 9B, the second insulating layer 116 may be deposited without forming spacers on the sidewalls of the plurality of the bit line structures. Accordingly, the second insulating layer 116 may be deposited without forming a void between the bit line structures 113 because the space between the bit lines is larger as compared with an embodiment wherein spacers are formed on the sidewalls of the bit line structures 113.

On the other hand, when the bit line conductive layer pattern 108a includes tungsten, a deposition of the second insulating layer 116 can cause the tungsten to oxidize. In particular, when the second insulating layer 116 is deposited at high temperature or with an oxide layer requiring high-temperature deposition process or high-temperature baking process, such as, for example, BPSG or spin-on-glass (SOG) film, side surfaces of the bit line conductive layer pattern 108a may be exposed and, thus, the tungsten of the bit line conductive layer pattern 108a may be oxidized. Oxidization of the tungsten may cause a lifting defect of the bit line conductive layer pattern 108a, i.e. the bit line conductive layer pattern 108a may be lifted due to a volume expansion of the tungsten. Accordingly, in some embodiments of the present invention, the second insulating layer 116 is deposited using, for example, a high-density plasma (HDP) process so as to reduce the likelihood of the occurrence of the above-mentioned tungsten oxidization. The HDP can be performed at a low temperature of about 400° C. or less without a producing a void.

A surface of the second insulating layer 116 is planarized using, for example, a CMP process using the fist insulating layer pattern 110a as a CMP stopper. In embodiments of the present invention that include the formation of the anti-reflection layer on the second insulating layer 116, the anti-reflection layer may be used as the CMP stopper instead of the first insulating layer pattern. Furthermore, the CMP process may be carried out so as to expose only a portion of the first insulating layer pattern 110a or to fully expose the first insulating layer pattern 110a.

Figure 10A:
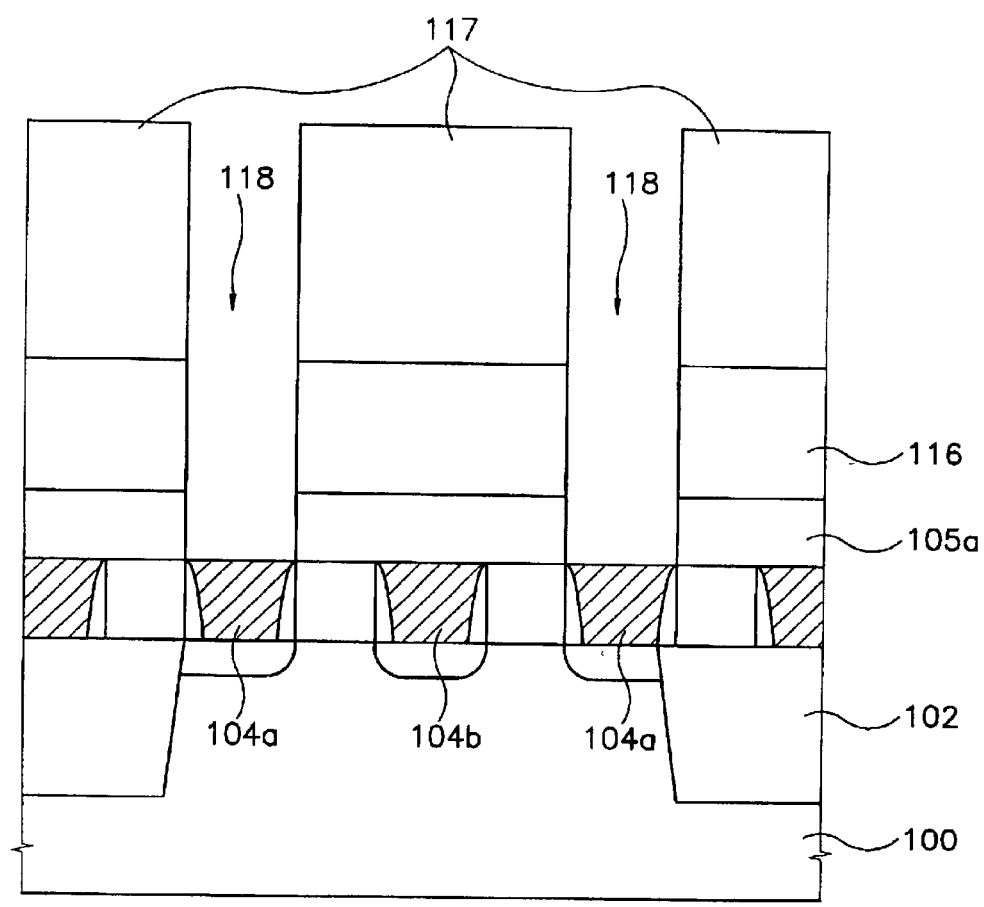
Figure 10B:
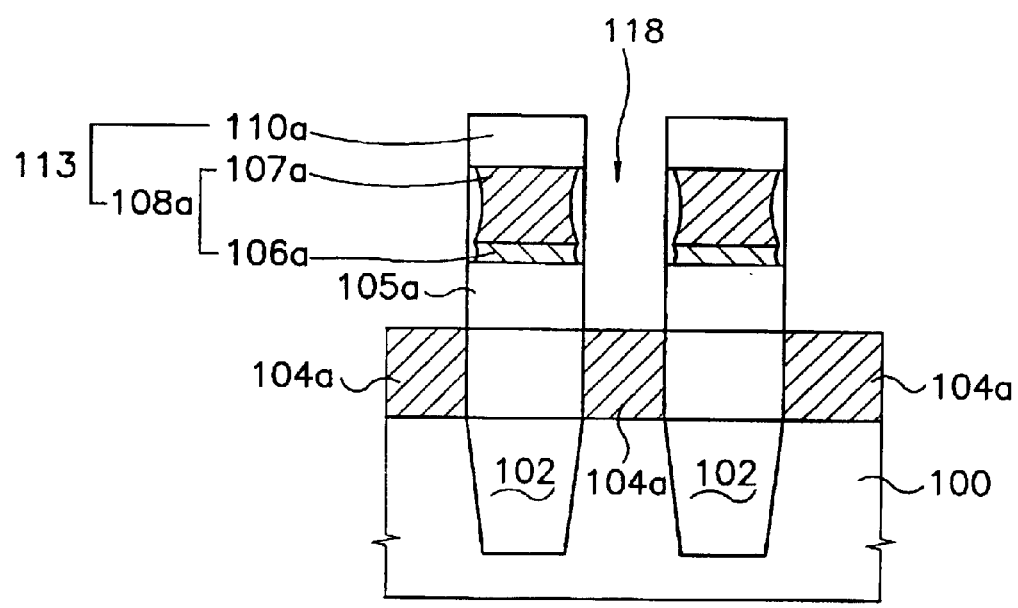

Now referring to FIGS. 10A and 10B, a process of forming a storage node contact hole 118 according to embodiments of the present invention will be described. The second photoresist pattern 117 is formed on the planarized second insulating layer 116 to define a contact hole region using photolithography. The second photoresist pattern 117 is formed into a linear shape substantially perpendicular to the bit line structures 113. The linear shaped second photoresist pattern 117 may increase an align margin in performing the photolithography as compared with a conventional hole-shaped photoresist pattern. In particular, when a conventional hole-shaped photoresist pattern is applied in a contact process, a respective layer comprising the bit line structures 113 may be deformed and generate misalignment, which may reduce process uniformity of the self-align contact process. In contrast, using the linear shaped photoresist pattern of the present invention during the contact process may allow the self-align contact process to be uniformly performed regardless of the misalignment.

The second insulating layer 116 and the insulating interlayer 105 are sequentially etched through the second photoresist pattern 117 with high etching selectivity with respect to the first insulting layer pattern 110a, such that the first pad electrode 104a is at least partially exposed. A high oxide-to-nitride layer selectivity can be applied since the spacer is not formed on the sidewalls of the bit line structures 113. Accordingly, the storage node contact hole 118, which is self-aligned with respect to the bit line structures 113, is formed. In embodiments of the present invention wherein the first insulating pattern layer 110a is wider than that of the bit line conductive layer pattern 108a, residue of the second insulating layer 116 remains on the sidewall of the bit line structures 113 in the storage node contact hole 118. The residue typically has a thickness corresponding to a width difference between the first insulating layer pattern 110a and the bit line conductive layer pattern 108a.

Figure 11A:
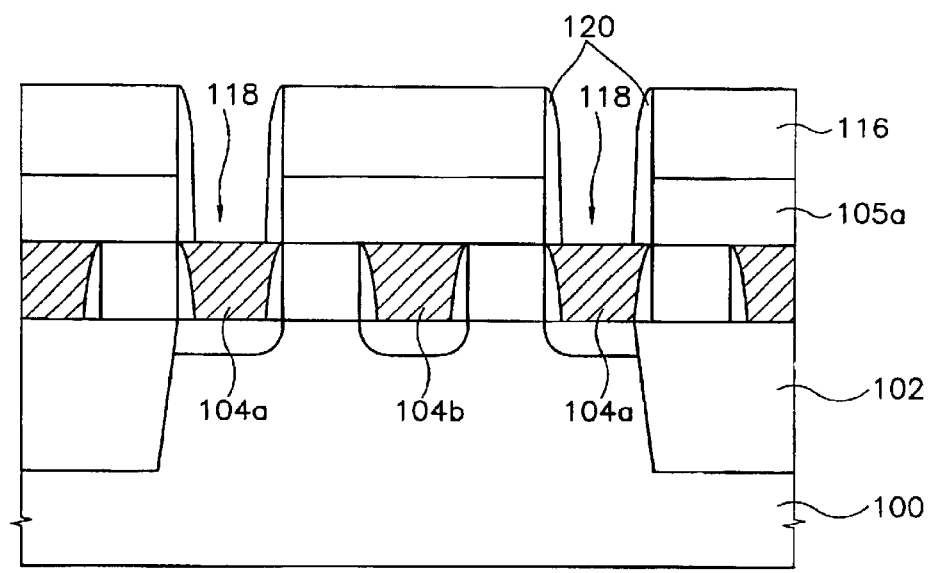

Now referring to FIGS. 11A and 11B, a process of forming a spacer 120 on sidewalls of the storage node contact hole 118 will be discussed. The second photoresist pattern 117 is removed by carrying out the etching process and the stripping process. A third insulating layer is formed successively on a sidewalls and bottom surface of the storage node contact hole 118 and an upper surface of the second insulating layer 116 having a thickness of about 400 Å. The third insulating layer is anisotropically etched to form the spacer 120 on the sidewalls of at least the second insulating layer 116 and the insulating interlayer pattern 105a in the storage node contact hole 118. The third insulating layer includes, for example, a silicon oxide layer having a dielectric constant lower than that of the silicon nitride layer, and therefore, the insulating layer may insulate the storage node contact hole 118 from the bit line conductive layer pattern 108a by reducing the parasitic capacitance. The third insulating layer may be formed of, for example, a composite layer structure in which the silicon nitride based material and the silicon oxide based material are sequentially stacked on each other.

The third insulating layer may be deposited without oxidizing the bit line conductive layer pattern 108a exposed in the storage node contact hole 118. Thus, the third insulating layer may include, for example, oxide material deposited at a low temperature that has a good step coverage and may be deposited using a liquid phase deposition (LPD) process or catalytic atomic layer deposition (CALD) process.

Figure 12B:
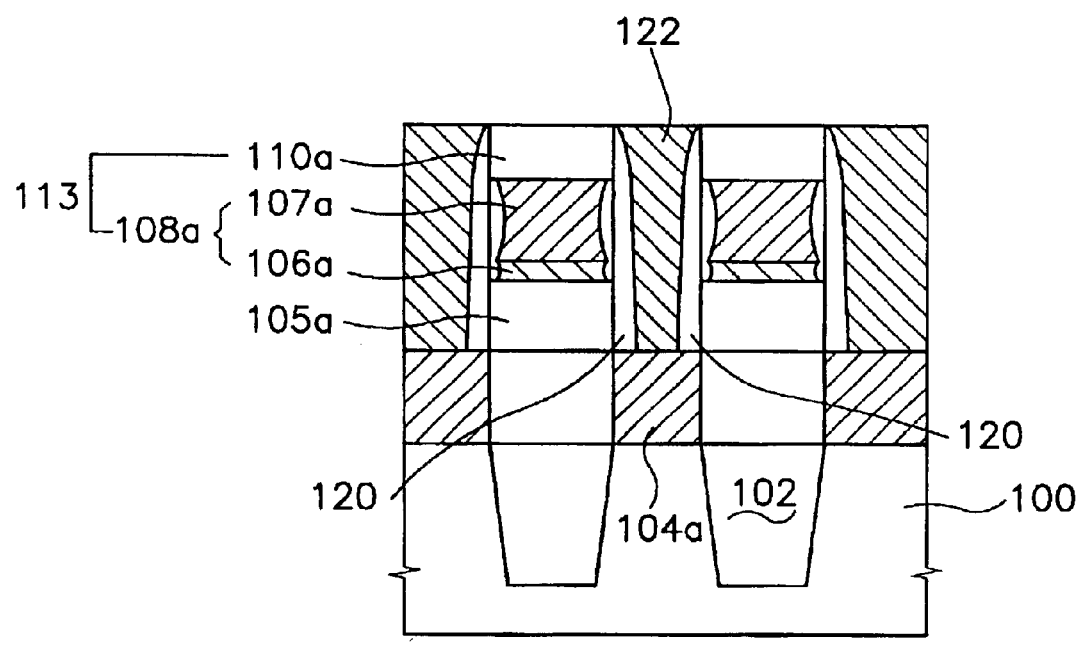

Referring now to FIGS. 12A and 12B, a process of forming a capacitor electrode layer 122 according to embodiments of the present invention will be described. A capacitor electrode layer 122 is formed in the storage node contact hole 118. The capacitor electrode layer 122 may include, for example, a polysilicon layer, a titanium nitride (TiN) layer and/or a tantalum nitride (TaN) layer. The capacitor electrode layer 122 is removed using, for example, a CMP process or an etch-back process, to expose at least a portion of a surface of the second insulating layer 116. Accordingly, the capacitor electrode layer 122 forms a plug shape in the storage node contact hole 118. Furthermore, the capacitor electrode layer 122 may be patterned as a storage electrode pattern using a conventional photolithography process.

Figure 13A:
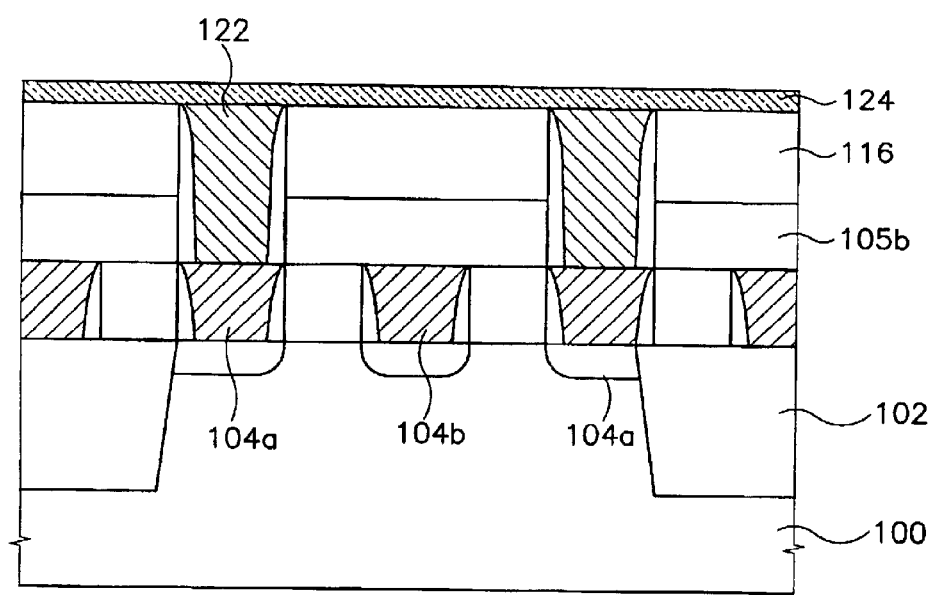
Figure 13B:
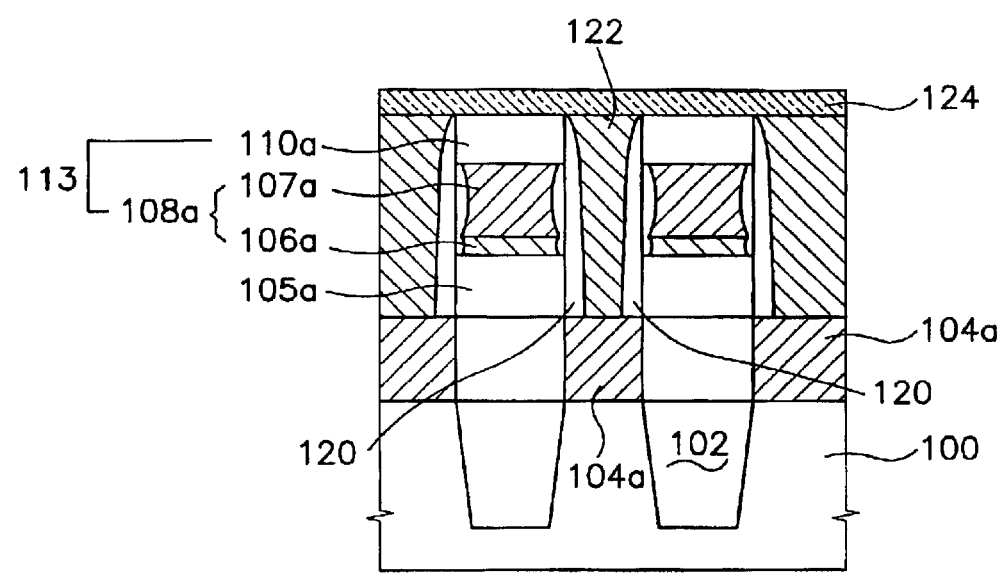

Referring now to FIGS. 13A and 13B, a process of forming a first stopping layer 124 according to embodiments of the present invention will be described. The first stopping layer 124 is formed on a surface of the capacitor electrode layer 122 and the second insulating layer 116. The first stopping layer 124 may reduce the likelihood that the spacer 120 formed on the sidewalls of the bit line structures 113 will be etched when an oxide layer is etched during a subsequent process. The first stopping layer 124 may include, for example, a silicon nitride layer having a high etching selectivity with respect to the silicon oxide layer. The first stopping layer 124 is formed to have a thickness that may be removed by post-etch treatment for removing residue to reduce possible damage to the lower structures. In some embodiments of the present invention, the first stopping layer 124 may be formed to have a thickness of from about 30 to about 150 Å using, for example, a plasma enhanced chemical vapor deposition (PECVD) process, an atomic layer deposition (ALD) process, and/or a chemical vapor deposition (CVD) process.

Figure 14A:
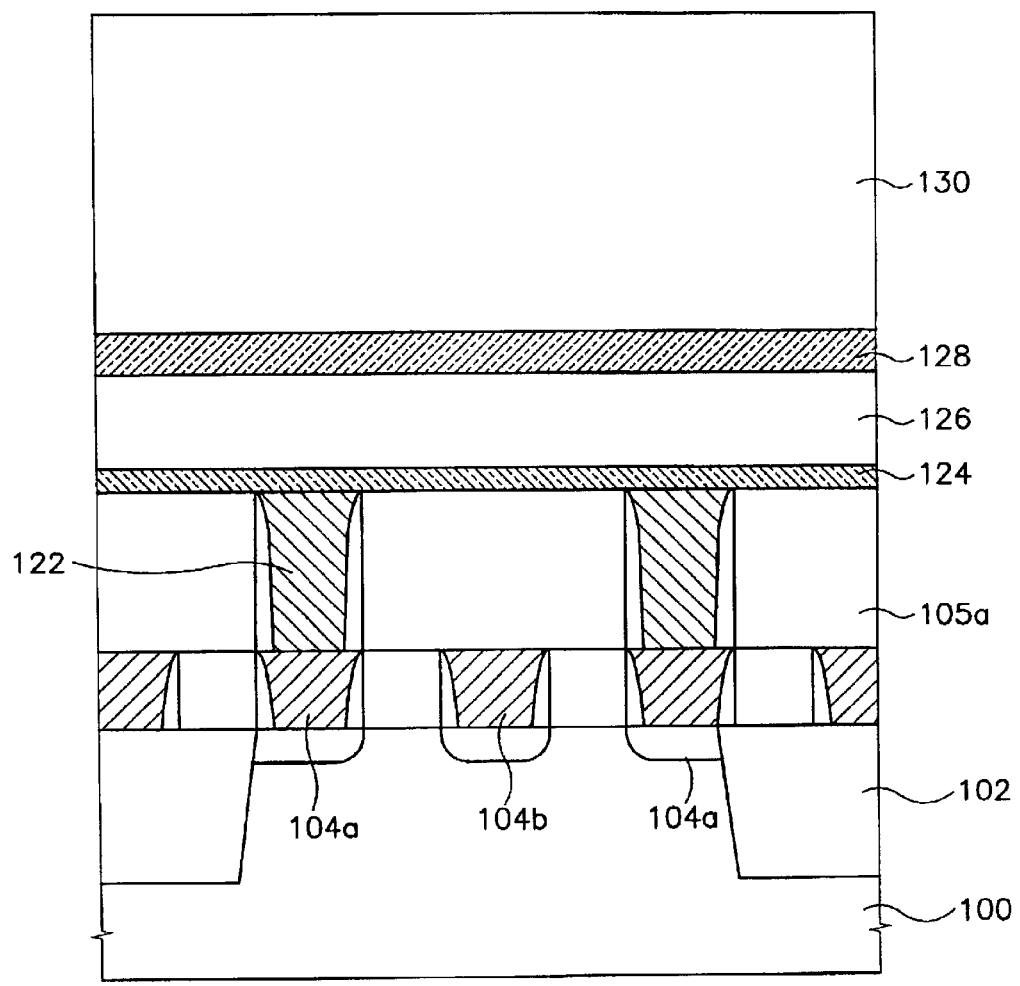
Figure 14B:
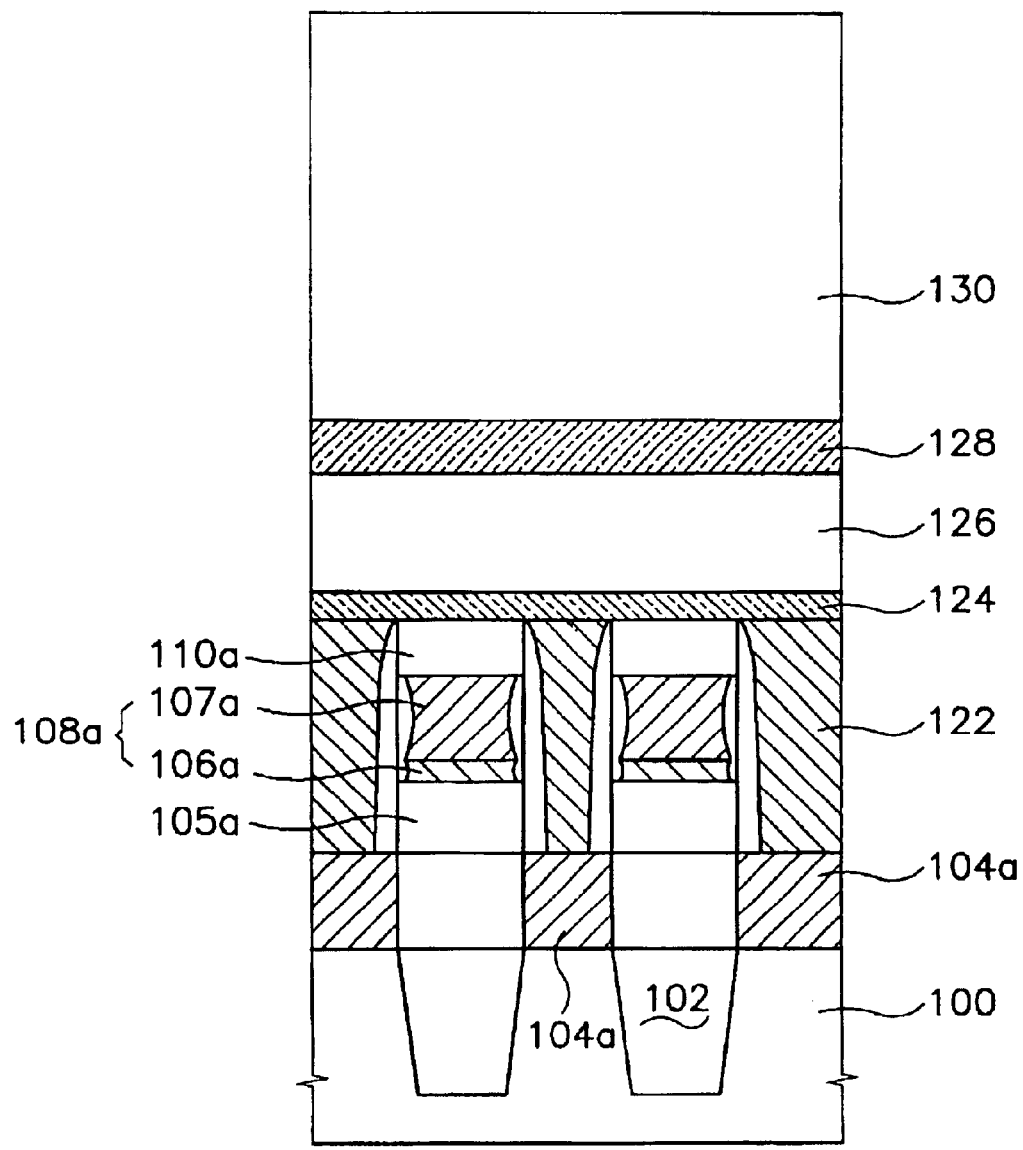

Referring now to FIGS. 14A and 14B, a process of forming a fourth insulating layer, a second stopping layer and a fifth insulating layer on the first stopping layer 124 according to embodiments of the present invention will be described. The fourth insulating layer 126 is formed on the first stopping layer 124 as a buffer layer. The second stopping layer 128 including, for example, silicon nitride, and the fifth insulating layer 130 are sequentially formed on the fourth insulating layer 126. The fourth insulating layer 126, the second stopping layer 128 and a fifth insulating layer 130 are formed into a storage node making electrical contact with the plug-shaped capacitor electrode layer 122. The storage node may be formed to have a thickness of from about 10,000 to about 13,000 Å so as to increase a capacitance of the capacitor. Accordingly, a total thickness of the fourth insulating layer 126, the second stopping layer 128 and a fifth insulating layer 130 is typically more than that of the storage node.

Due to the thickness of the fourth and fifth insulating layers 126, 130, a storage node contact hole making contact with the capacitor electrode layer 122 may not be uniformly formed. Accordingly, the second stopping layer 128 may be formed between the fourth insulating layer 126 and the fifth insulating layer 130. The fourth insulating layer 126 may be formed to have a thickness of from about 2,000 to about 4,000 Å to allow the etching depth to be controlled during a successive anisotropical etching process. Furthermore, although the fifth insulating layer 130 is etched with high etching selectivity with respect to the second stopping layer 128, the second stopping layer 128 may be partially etched at such a portion that an etching rate is relatively high. Therefore, the second stopping layer 128 is formed such that it is thick enough so as not to be completely removed during the etching process of the fifth insulating layer 130. The second stopping layer 128 may be formed to have a thickness of from about 500 to about 1,000 Å.

Figure 15A:
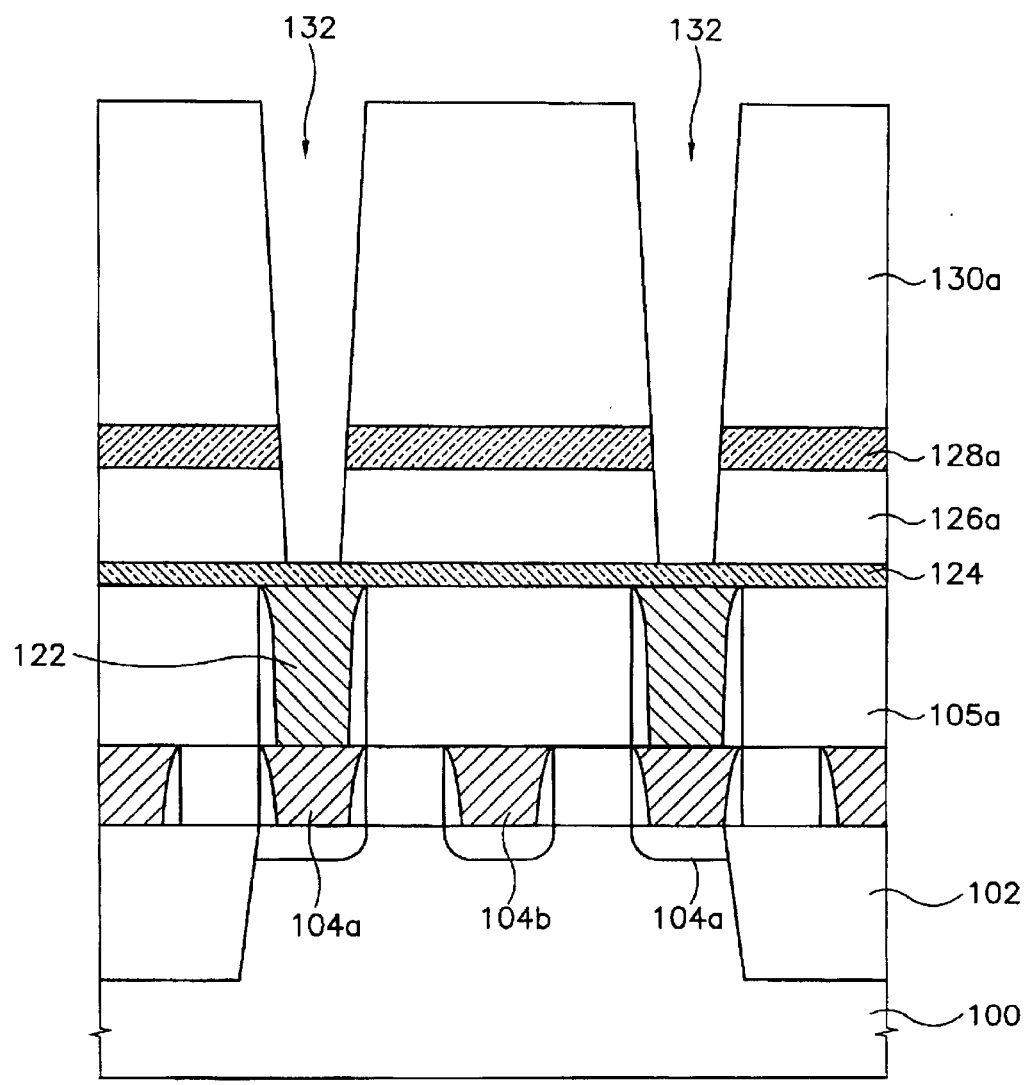

Referring now to FIGS. 15A and 15B, a process of forming a preliminary contact hole 132 that contacts the plug-shaped capacitor electrode layer 122 according to embodiments of the present invention will be described. The first stopping layer 124 is exposed by sequentially and partially etching the fifth insulating layer 130, the second stopping layer 128, and the fourth insulating layer 126. The fifth insulating layer 130 is partially etched through the etching mask of a third photoresist pattern with a high etching selectivity with respect to the second stopping layer 128, to expose at least a portion of an upper surface of the second stopping layer 128. However, since the fifth insulating layer 130 is formed to have a relatively large thickness of from about 7,000 to about 10,000 Å, an etching rate of the fifth insulating layer 130 may vary with the position of the integrated circuit substrate, such that the contact hole does not have a precise and uniform depth. Thus, the fifth insulating layer 130 may be over etched so as to fully expose the second stopping layer 128 and, therefore, the second stopping layer 128 may be formed to be thick enough such that it is not totally removed during the etching process of the fifth insulating layer 130. The second stopping layer 128 and a fourth insulating layer 126 are sequentially etched to expose at least a portion of the upper surface of the first stopping layer 124.

The fourth insulating layer 126 is formed to be relatively thin, for example, having a thickness of from about 2,000 to about 4,000 Å. An etching rate of the fifth insulating layer 130 is typically relatively uniform, so that the contact hole may be formed to have precise and uniform depth. Therefore, the fourth insulating layer 126 may be accurately etched to expose the first stopping layer 124.

Figure 16B:
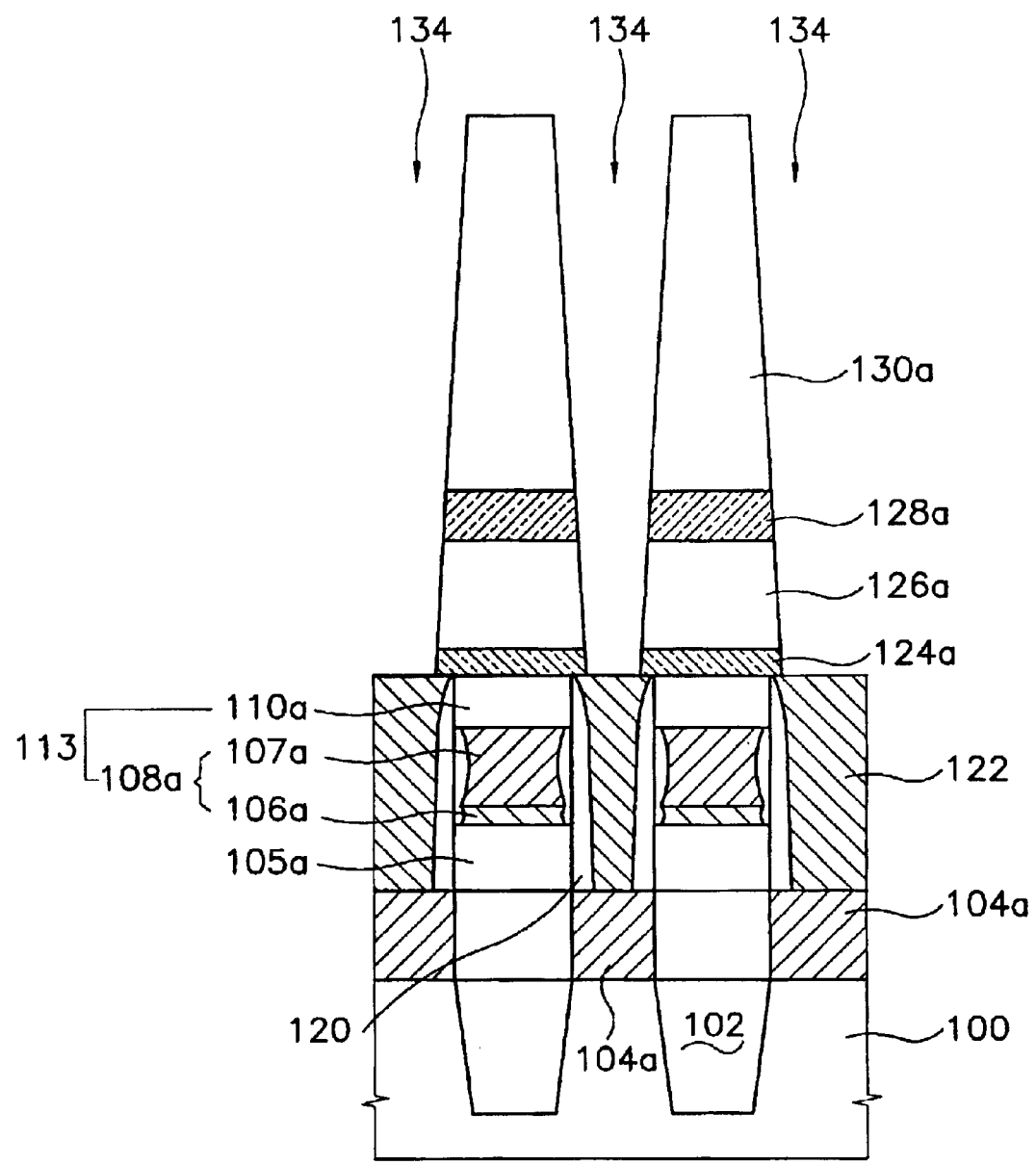

Referring now to FIGS. 16A and 16B, a process of forming a contact hole 134 that contacts the plug-shaped capacitor electrode layer 122 will be described. The contact hole 134 has a window portion which is exposed by a fifth insulating layer pattern 130a, a second stopping layer pattern 128a, a fourth insulating layer pattern 126a, and a first stopping layer pattern 124a. The exposed first stopping layer 124 is etched to form a contact hole 134 that contacts the capacitor electrode layer 122. The contact hole 134 is etched with a post-etch treatment for removing residue, such that damage to the capacitor electrode layer 122 disposed below the first stopping layer 124 may be reduced. The contact resistance of the capacitor electrode layer 122 may also be also reduced. If the first stopping layer 124 is present when the contact hole 134 is formed, the spacer 120 formed on the sidewall of the bit line structure 113 may be etched by the photo misalignment between the contact hole 134 and the capacitor electrode layer 122. If the surface of the capacitor electrode layer 122 is not accurately exposed by the third photoresist pattern, and a bottom surface of the contact hole 134 does not make contact with the capacitor electrode layer 122, the spacer 120 including, for example, a silicon oxide layer, may be etched during the etching process of the fourth insulating layer 126. Etching the spacer 120 may cause the capacitor electrode layer 122 to be electrically coupled with the bit line conductive layer pattern 108a, which may result in the pattern bridge between the bit line conductive layer pattern 108a and the capacitor electrode layer 112. Accordingly, the functionality of the integrated circuit device, such as DRAM including the spacer 120, may be influenced or may not function at all.

According to embodiments of the present invention, the first stopping layer 124 is provided, and the fourth insulating layer 126 is etched using an etchant having a high etching selectivity with respect to the first stopping layer 124. Accordingly, the first stopping layer 124 is hardly etched during the etching the fourth insulating layer 126. Consequently, although a photo misalign may be generated between the contact hole 134 and the capacitor electrode layer 112, the spacer 120 may not be etched.

Figure 17A:
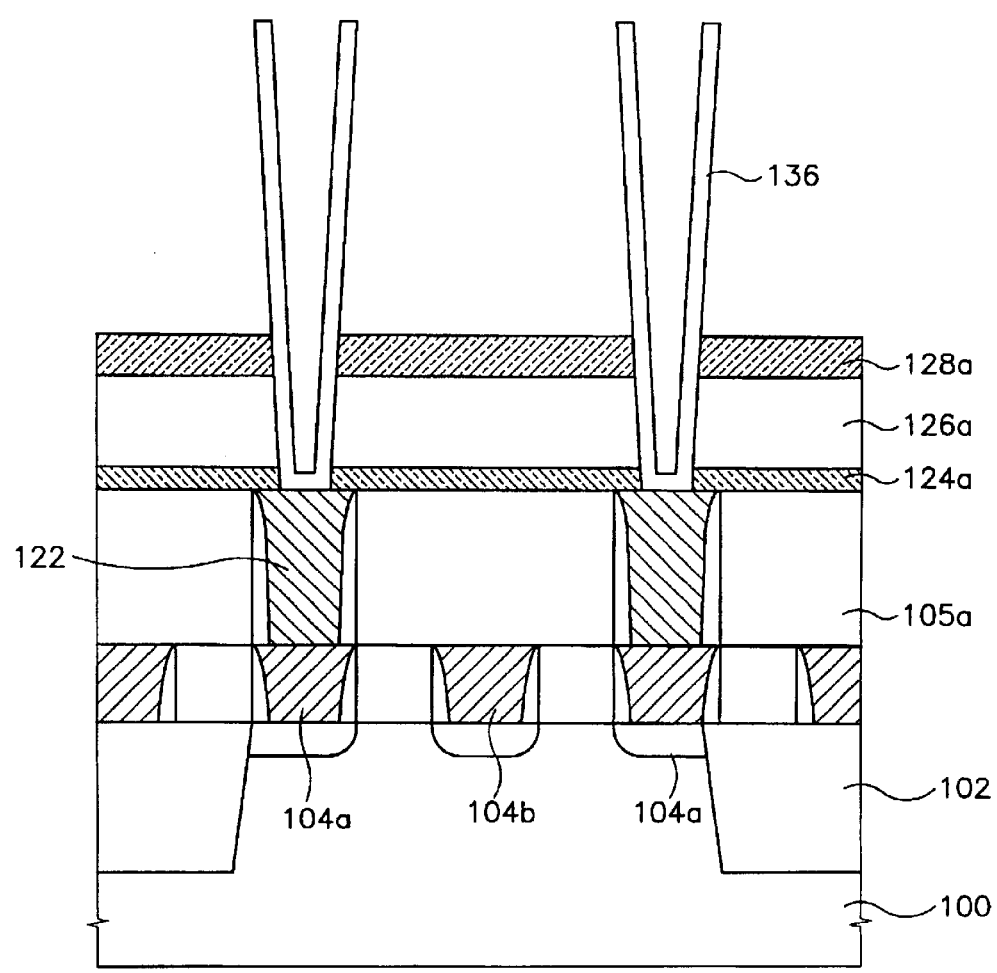
Figure 17B:
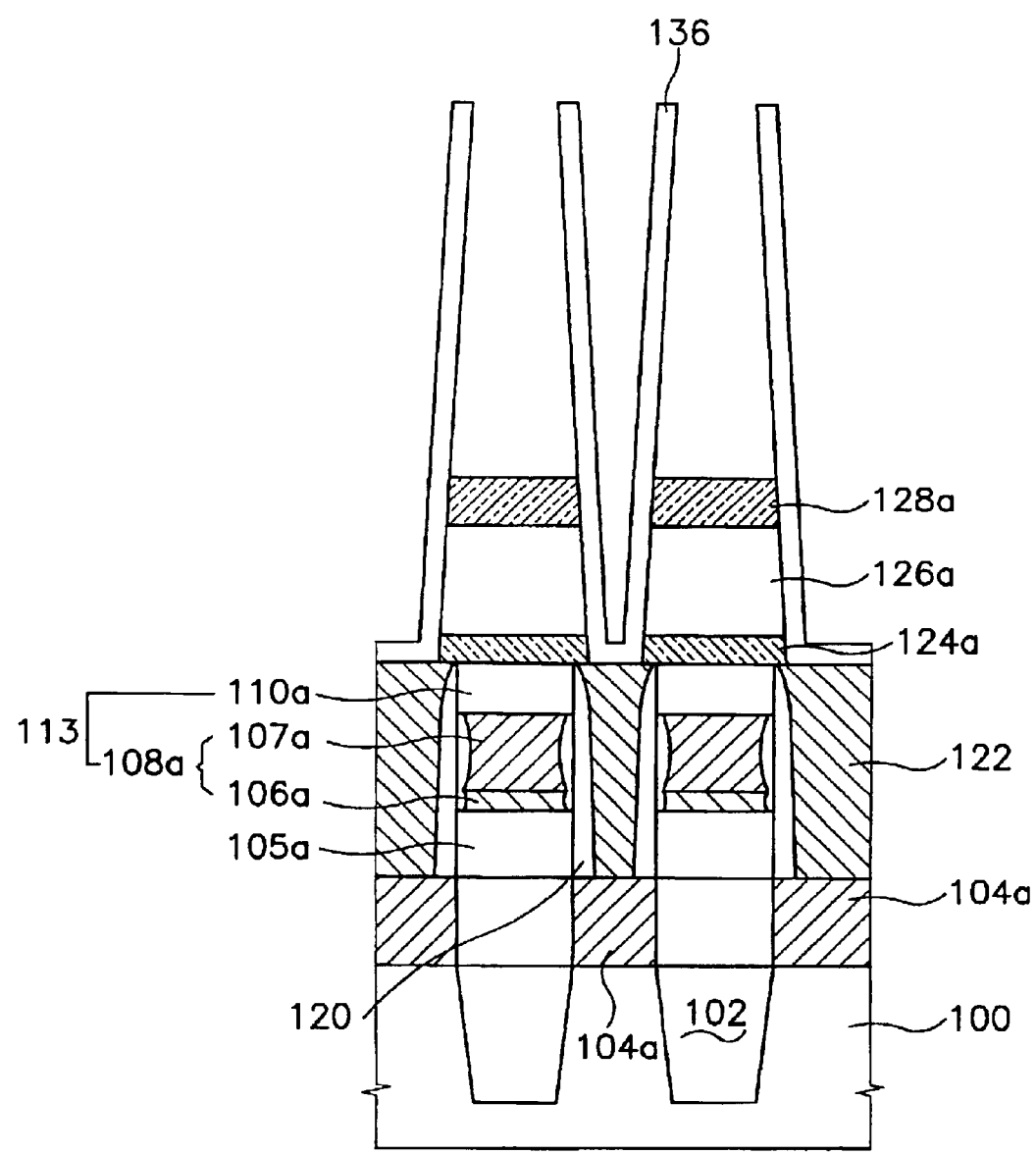
Figure 18A:
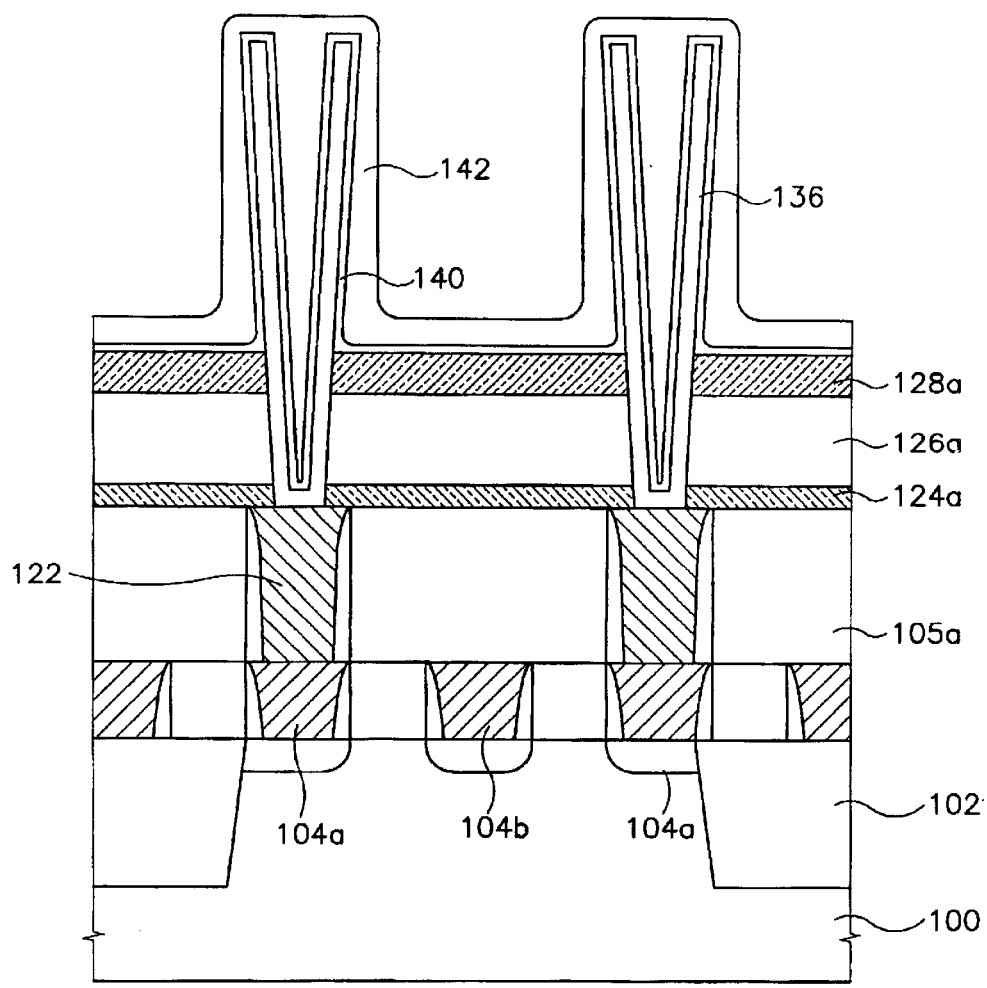

Referring now to FIGS. 17A and 17B, a process of forming a storage node that contacts the capacitor electrode layer 122 will be described. A doped polysiliconlayer is deposited on sidewalls and a bottom surface of the contact hole 134 and a surface of the fifth insulating layer pattern 130a. The contact hole 134 may be filled with the polysiliconlayer. The polysiliconlayer is removed using, for example, a CMP process, to expose at least a portion of the surface of the fifth insulating layer pattern 130a, so that the storage node 136 can be separated. The remaining fifth insulating layer pattern 130a is etched away by carrying out, for example, a wet etching process, to form a cylindrical-shaped storage node 136. The second stopping layer pattern 128a and the fourth insulating layer pattern 126a may remain without being etched since the second stopping layer pattern 128a is not etched by the etching process used to form the cylindrical-shaped storage node 136. Consequently, the second stopping layer pattern 128a and the fourth insulating layer pattern 126a may support the storage node 136, so that a slanting of the storage node 136 can be reduced. As illustrated in FIGS. 18A and 18B, a dielectric layer 140 and a plate electrode layer 142 can be sequentially formed on the storage node 136.

As described above with respect to FIGS. 3 through 18B, contact holes may be formed between electrical wirings in integrated circuit devices. According to embodiments of the present invention, problems present in conventional methods of forming contact holes, for example, the pattern bridge phenomenon, may be reduced. In addition, a parasitic capacitance between the electrical wires and conductive material formed in the contact hole may also be reduced, so that the operating speed and reliability of the integrated circuit device may be improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a contact hole, the method comprising:
    forming a conductive plug in a conductive plug contact hole on a substrate;
    forming a first insulating layer on the conductive plug;
    forming a second insulating layer on the first insulating layer;
    etching the second insulating layer to expose at least a portion of the first insulating layer; and
    etching the first insulating layer to expose at least a portion of the conductive plug.

2. A method according to claim 1, wherein etching the second insulating layer comprises preferentially etching the second insulating layer with respect to the first insulating layer and wherein etching the first insulating layer comprises preferentially etching the first insulating layer with respect to the second insulating layer and the conductive plug.

3. A method according to claim 2, wherein the second insulating layer is thicker than the first insulating layer.

4. A method according to claim 3, wherein the first insulating layer has a thickness of from about 30 to about 150 Å.

5. A method of forming a contact hole, the method comprising:
    forming a conductive plug on a substrate;
    forming a first insulating layer on the conductive plug;
    forming a second insulating layer on the first insulating layer;
    etching the second insulating layer to expose at least a portion of the first insulating layer;
    etching the first insulating layer to expose at least a portion of the conductive plug;
    forming a first conductive layer on the substrate;
    forming a third insulating layer on the first conductive layer, the first conductive layer and the third insulating layer including sidewalls that define a contact hole therein;
    forming a spacer on the sidewalls of the first conductive layer and the third insulating layer; and
    depositing a conductive material in the contact hole to form the conductive plug.

6. A method according to claim 5, wherein forming the first conductive layer comprises:
    forming a barrier metal layer on the substrate; and
    forming a metal layer on the barrier metal layer.

7. A method according to claim 6, wherein the barrier metal layer comprises titanium and titanium nitride and wherein the metal layer comprises tungsten.

8. A method according to claim 5, wherein a width of the first conductive layer is smaller than a width of the third insulating layer.

9. A method for forming a contact hole in an integrated circuit device, comprising:
    i) forming a plurality of first patterns on an integrated circuit substrate, each of said first patterns including a first conductive layer pattern and a first insulating layer pattern that are sequentially stacked on said integrated circuit substrate;
    ii) forming a spacer on sidewalls of said first patterns;
    iii) forming a conductive plug by filling up a space between said first patterns including said spacer with a conductive material;
    iv) forming a first stopping layer directly on an upper surface of said first pattern and on a surface of said conductive plug;
    v) forming a second insulating layer on said first stopping layer; and
    vi) sequentially etching a predetermined portion of said second insulating layer and said first stopping layer to form the contact hole that makes electrical contact with said conductive plug.

10. The method according to claim 9, wherein said first stopping layer comprises a silicon nitride layer.

11. The method according to claim 9, wherein said first stopping layer is formed by plasma enhanced chemical vapor deposition (PECVD), atomic layer deposition (ALD), or chemical vapor deposition (CVD).

12. The method according to claim 9, wherein said first stopping layer has a thickness in a range of about 30 Å to 150 Å.

13. The method according to claim 9, wherein said spacer comprises silicon oxide based material.

14. The method according to claim 13, wherein said silicon oxide layer is deposited at a temperature of about 400° C. or less.

15. A method for forming a contact hole in an integrated circuit device, comprising:
    i) forming a plurality of first patterns on an integrated circuit substrate, each of said first patterns including a first conductive layer pattern and a first insulating layer pattern that are sequentially stacked on said integrated circuit substrate;

ii) forming a spacer on sidewalls of said first patterns;

iii) forming a conductive plug by filling up a space between said first patterns including said spacer with a conductive material;

iv) forming a first stopping layer to cover an upper surface of said first pattern and said conductive plug;

v) forming a second insulating layer on said first stopping layer; and vi) sequentially etching a predetermined portion of said second insulating layer and said first stopping layer to form the contact hole that makes electrical contact with said conductive plug, wherein said silicon oxide layer is deposited by catalytic atomic layer deposition (CALD) and wherein said spacer comprises silicon oxide based material.

16. A method for forming a contact hole in an integrated circuit device, comprising:

i) fanning a plurality of first patterns on an integrated circuit substrate, each of said first patterns including a first conductive layer pattern and a first insulating layer pattern that are sequentially stacked on said integrated circuit substrate;

ii) forming a spacer on sidewalls of said first patterns;

iii) forming a conductive plug by filling up a space between said first patterns including said spacer with a conductive material;

iv) forming a first stopping layer to cover an upper surface of said first pattern and said conductive plug;

v) forming a second insulating layer on said first stopping layer; and vi) sequentially etching a predetermined portion of said second insulating layer and said first stopping layer to form the contact hole that makes electrical contact with said conductive plug, wherein said first insulation layer pattern is a single layer comprising silicon nitride based material, or a composite layer comprising silicon nitride based material and silicon oxide based material.

17. A method for forming a contact hole in an integrated circuit device, comprising:

i) forming a plurality of first patterns on an integrated circuit substrate, each of said first patterns including a first conductive layer pattern and a first insulating layer pattern that are sequentially stacked on said integrated circuit substrate;

ii) fanning a spacer on sidewalls of said first patterns;

iii) forming a conductive plug by filling up a space between said first patterns including said spacer with a conductive material;

iv) forming a first stopping layer to cover an upper surface of said first pattern and said conductive plug;

v) forming a second insulating layer on said first stopping layer; and vi) sequentially etching a predetermined portion of said second insulating layer and said first stopping layer to form the contact hole that makes electrical contact with said conductive plug, wherein said first patterns have a line shape with a predetermined interval between said first patterns.

18. A method for forming a contact hole in an integrated circuit device, comprising:

i) forming a plurality of first patterns on an integrated circuit substrate, each of said first patterns including a first conductive layer pattern and a first insulating layer pattern that are sequentially stacked on said integrated circuit substrate;

ii) forming a spacer on sidewalls of said first patterns;

iii) forming a conductive plug by filling up a space between said first patterns including said spacer with a conductive material;

iv) forming a first stopping layer to cover an upper surface of said first pattern and said conductive plug;

v) forming a second insulating layer on said first stopping layer; and vi) sequentially etching a predetermined portion of said second insulating layer and said first stopping layer to form the contact hole that makes electrical contact with said conductive plug, wherein said first conductive layer pattern includes a lower pattern comprising a metallic compound and an upper pattern comprising metal, said upper pattern being stacked on said lower pattern.

19. The method according to claim 18, wherein said lower pattern comprises titanium and titanium nitride, and said upper pattern comprises tungsten.

20. A method for forming a contact hole in an integrated circuit device, comprising:

i) forming a plurality of first patterns on an integrated circuit substrate, each of said first patterns including a first conductive layer pattern and a first insulating layer pattern that are sequentially stacked on said integrated circuit substrate;

ii) forming a spacer on sidewalls of said first patterns;

iii) forming a conductive plug by filling up a space between said first patterns including said spacer with a conductive material;

iv) forming a first stopping layer to cover an upper surface of said first pattern and said conductive plug;

v) forming a second insulating layer on said first stopping layer; and vi) sequentially etching a predetermined portion of said second insulating layer and said first stopping layer to form the contact hole that makes electrical contact with said conductive plug, wherein said step of forming said conductive plug comprises the sub-steps of:

i) continuously forming a second conductive layer to fill up a space between said first patterns with a conductive material by depositing said conductive material on a side surface of said space, a surface of said integrated circuit substrate and surfaces of said first patterns; and ii) polishing a surface of said second conductive layer to expose said surface of said first patterns.

21. The method according to claim 20, wherein said second conductive layer comprises titanium nitride, tantalum nitride or doped polysilicon.

22. A method for forming a contact hole in an integrated circuit device, comprising:

i) forming a plurality of first patterns on an integrated circuit substrate, each of said first patterns including a first conductive layer pattern and a first insulating layer pattern that are sequentially stacked on said integrated circuit substrate;

ii) forming a silicon oxide layer that fills up a space between said first patterns with silicon oxide; and iii) forming a first contact hole by etching a predetermined portion of said silicon oxide layer, said first contact hole exposing a sidewall of said first patterns and a surface of said integrated circuit substrate corresponding to an interval of said first pattern;

iv) forming a spacer on sidewalls of said first patterns;

v) forming a conductive plug by filling up a space between said first patterns including said spacer with a conductive material;

vi) forming a first stopping layer to cover an upper surface of said first pattern and said conductive plug;

vii) forming a second insulating layer on said first stopping layer; and viii) sequentially etching a predetermined portion of said second insulating layer and said first stopping layer to form the contact hole that makes electrical contact with said conductive plug.

23. The method according to claim 22, wherein said step of forming said first contact hole comprises the sub-steps of:

i) forming a linear photoresist pattern perpendicular to said first patterns; and ii) etching said silicon oxide layer by using said photoresist pattern and said first insulating layer pattern that is an upper layer of said first pattern as an etching mask.

24. A method for forming a contact hole in an integrated circuit device, comprising:

i) forming a plurality of first patterns on an integrated circuit substrate, each of said first patterns including a first conductive layer pattern and a first insulating layer pattern that are sequentially stacked on said integrated circuit substrate;

ii) forming a spacer on sidewalls of said first patterns;

iii) forming a conductive plug by filling un a space between said first patterns including said spacer with a conductive material;

iv) forming a first stopping layer to cover an upper surface of said first pattern and said conductive plug;

v) forming a second insulating layer on said first stopping layer; and vi) sequentially etching a predetermined portion of said second insulating layer and said first stopping layer to form the contact hole that makes electrical contact with said conductive plug, wherein said predetermined portion of said first stopping layer is etched by a post-etch treatment for removing residue of said second insulating layer.

* * * * *

UNITED STATES PATENT AND TRADEMARK OFFICE
CERTIFICATE OF CORRECTION

PATENT NO. : 6,818,551 B2
DATED : November 16, 2004
INVENTOR(S) : Jin et al.

It is certified that error appears in the above-identified patent and that said Letters Patent is hereby corrected as shown below:

Column 15,
Line 47, should read -- ii) forming a spacer on sidewalls of said first patterns --

Column 18,
Line 7, should read -- iii) forming a conductive plug by filling up a space --

Signed and Sealed this

Fifteenth Day of February, 2005

JON W. DUDAS
*Director of the United States Patent and Trademark Office*